(12) United States Patent
Takahashi et al.

(10) Patent No.: US 8,749,420 B2
(45) Date of Patent: Jun. 10, 2014

(54) A/D CONVERTER, A/D CONVERSION METHOD, AND PROGRAM

(75) Inventors: Tomohiro Takahashi, Kanagawa (JP); Hiroki Ui, Tokyo (JP)

(73) Assignee: Sony Corporation, Tokyo (JP)

( * ) Notice: Subject to any disclaimer, the term of this patent is extended or adjusted under 35 U.S.C. 154(b) by 79 days.

(21) Appl. No.: 13/398,994

(22) Filed: Feb. 17, 2012

(65) Prior Publication Data

US 2012/0229319 A1    Sep. 13, 2012

(30) Foreign Application Priority Data

Mar. 9, 2011    (JP) .................................. 2011-052084

(51) Int. Cl.
*H03M 1/12*    (2006.01)
(52) U.S. Cl.
USPC ......................................... 341/155; 341/131

(58) Field of Classification Search
USPC ........................................ 341/155, 131, 139
See application file for complete search history.

(56) References Cited

U.S. PATENT DOCUMENTS

| | | | | |
|---|---|---|---|---|
| 5,231,398 A | * | 7/1993 | Topper | 341/156 |
| 5,610,604 A | * | 3/1997 | Leacock et al. | 341/138 |
| 7,443,333 B2 | * | 10/2008 | Garrity et al. | 341/163 |
| 7,561,091 B1 | * | 7/2009 | Muenter et al. | 341/155 |
| 8,009,075 B2 | * | 8/2011 | Currivan et al. | 341/155 |
| 8,462,037 B2 | * | 6/2013 | Singer et al. | 341/155 |
| 2010/0128817 A1 | * | 5/2010 | Philips et al. | 375/316 |

FOREIGN PATENT DOCUMENTS

| | | |
|---|---|---|
| JP | 2005-278135 A | 10/2005 |
| JP | 2006-033453 | 2/2006 |

* cited by examiner

*Primary Examiner* — Brian Young
(74) *Attorney, Agent, or Firm* — Rader, Fishman & Grauer PLLC

(57) ABSTRACT

An A/D converter switches resolution of m bits to resolution of n bits smaller than the m bits at a predetermined time.

20 Claims, 46 Drawing Sheets

Figure 6:
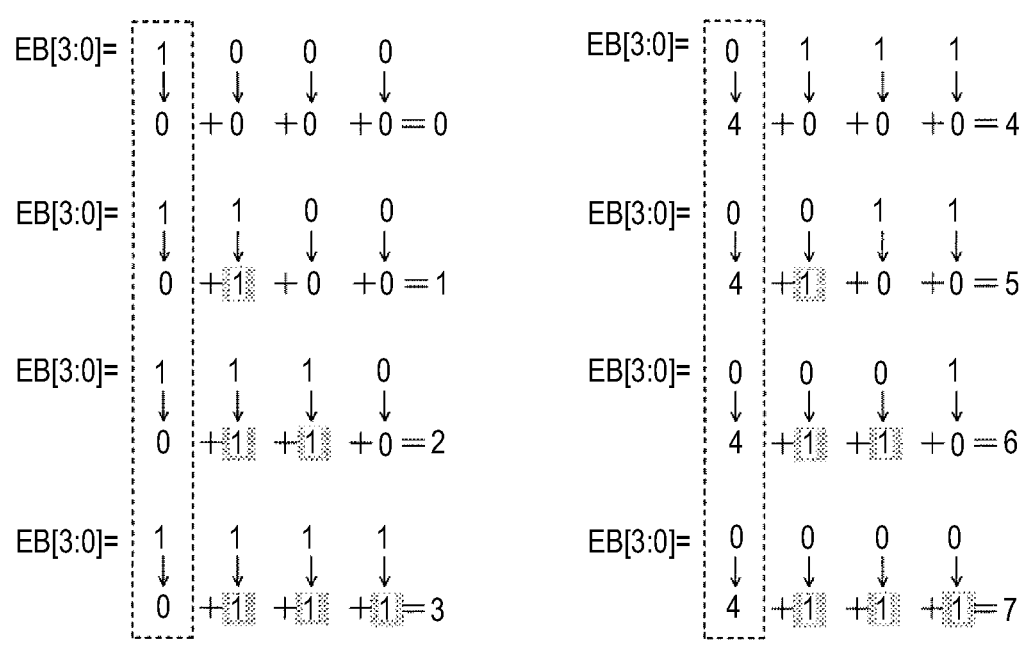

| EB[3] | EB[2] | EB[1] | EB[0] | DECODE VALUE | |
|---|---|---|---|---|---|
| | | | | Bin. | Dec. |
| 1 | 0 | 0 | 0 | 000 | +0 |
| 1 | 1 | 0 | 0 | 001 | +1 |
| 1 | 1 | 1 | 0 | 010 | +2 |
| 1 | 1 | 1 | 1 | 011 | +3 |
| 0 | 1 | 1 | 1 | 100 | +4 |
| 0 | 0 | 1 | 1 | 101 | +5 |
| 0 | 0 | 0 | 1 | 110 | +6 |
| 0 | 0 | 0 | 0 | 111 | +7 |

| EB[3] | EB[1] | DECODE VALUE | |
|---|---|---|---|
| | | Bin. | Dec. |
| 1 | 0 | 000 | +0 |
| 1 | 1 | 010 | +2 |
| 0 | 1 | 100 | +4 |
| 0 | 0 | 110 | +6 |

| EB[3] | DECODE VALUE | |
|---|---|---|
| | Bin. | Dec. |
| 1 | 000 | +0 |
| 0 | 100 | +4 |

FIG.28

| CLKB | L | H | L | H |
|---|---|---|---|---|
| CLKD | L | H | H | L |
| MAXIMUM ERROR | 2LSB | 2LSB | 1LSB | 1LSB |

FIG.31

| CLKB | L | L | H | H | L | L | H | H |
|------|---|---|---|---|---|---|---|---|
| CLKC | L | H | L | H | L | H | L | H |
| CLKD | L | L | H | H | H | H | L | L |
| MAXIMUM ERROR | 3LSB | 1LSB | 1LSB | 3LSB | 1LSB | 1LSB | 1SB | 1LSB |

FIG.34

| TDC2SEL | TDC1SEL | OPERATION MODE |
|---|---|---|
| 0 | 0 | 3bit TDC |
| 1 | 0 | 2bit TDC |
| 1 | 1 | 1bit TDC |
| 0 | 1 | ———— |

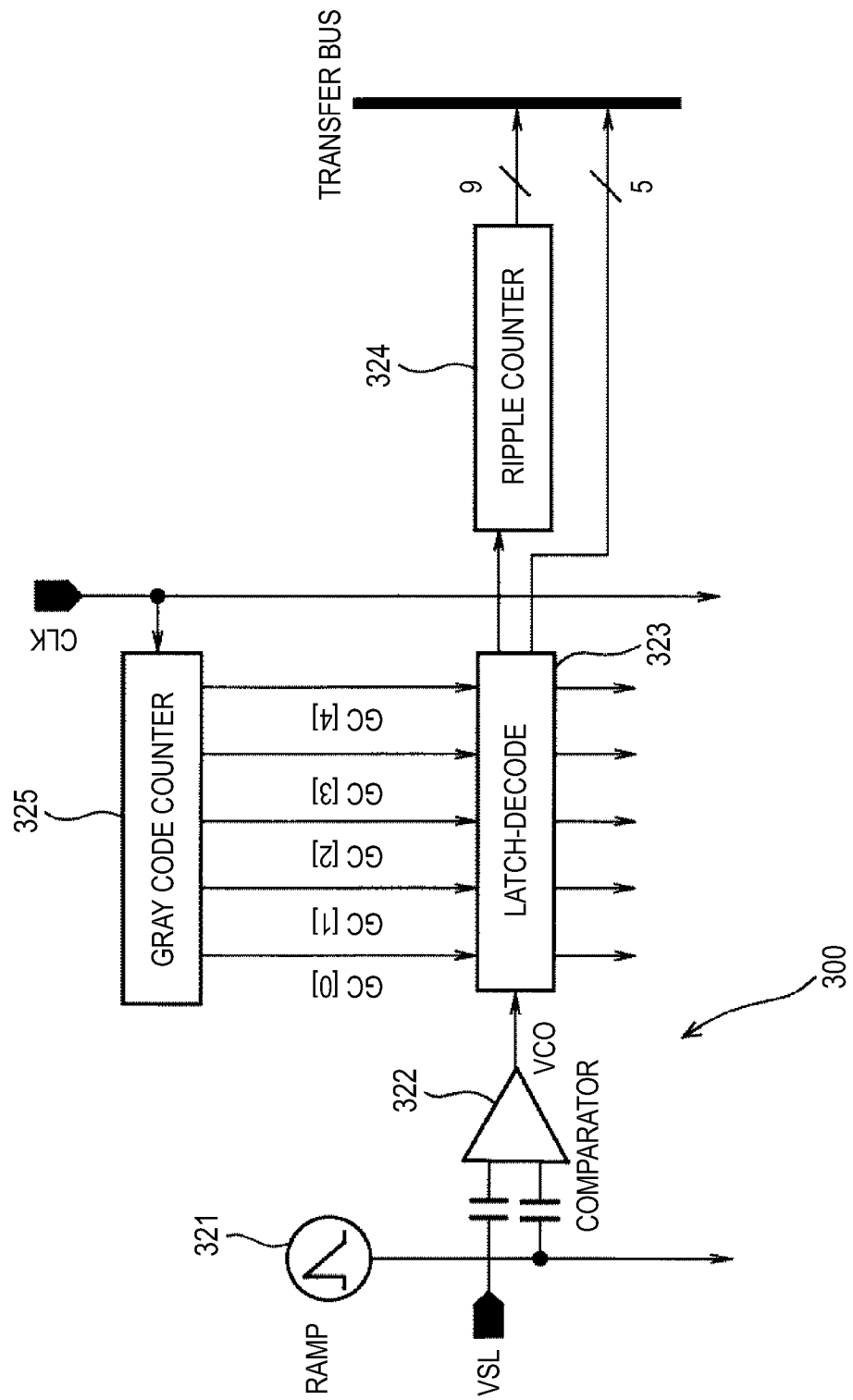

FIG.45

| GC [0] | L | L | H | H |
|---|---|---|---|---|
| GC [1] | L | H | L | H |
| MAXIMUM ERROR | 3LSB | 3LSB | 2LSB | 2LSB |

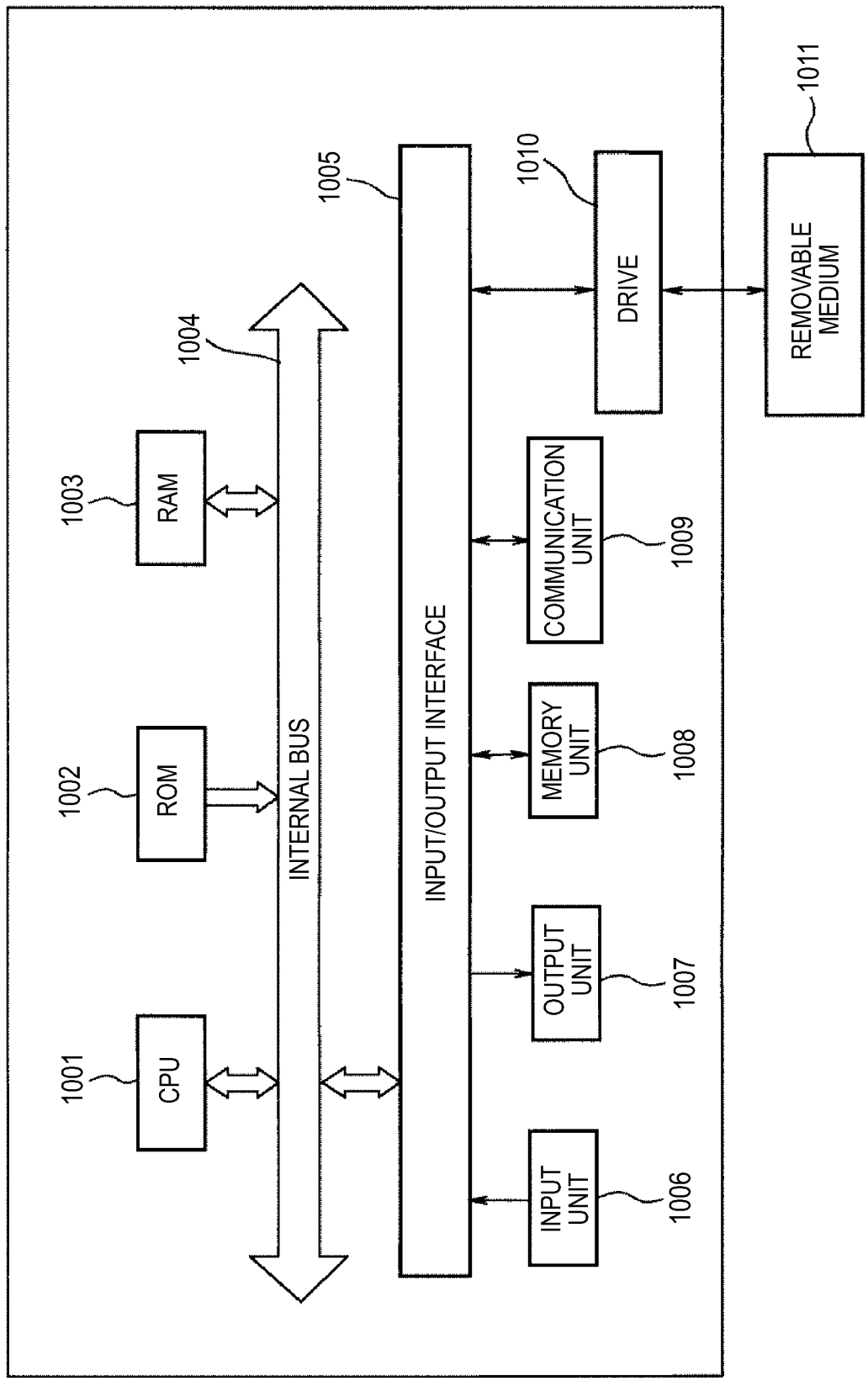

A/D CONVERTER, A/D CONVERSION METHOD, AND PROGRAM

FIELD

The present disclosure relates to an A/D converter, an A/D conversion method, and a program, and specifically relates to an A/D converter, an A/D conversion method, and a program that can reduce power consumption.

BACKGROUND

In an image sensor for taking images, a structure having comparators that compare pixel outputs and a ramp-shaped reference potential and ripple counters for measurement of times that elapse before the magnitude relations between the pixel outputs and the reference potential are reversed with respect to each column has been proposed (see Patent Document 1 (JP-A-2006-33453) and Patent Document 2 (JP-A-2005-278135)).

FIG. 1 shows a typical circuit example having a comparator and a counter. FIG. 2 is a timing chart of the circuit in FIG. 1. In the circuit shown in FIG. 1, sweeping of the reference voltage Vramp is started in the comparator 1 and the count operation of the counter 2 is started at the same time. When the reference voltage Vramp is below the input voltage VSL, the output signal VCO of the comparator 1 is inverted from the high level to the low level. At the falling edge, the count operation of the counter 2 is stopped. The count value VCNT has a one-on-one relationship with the voltage width swept by the reference voltage Vramp, and the count value VCNT is a result of analog-digital (AD) conversion of the input voltage.

In Patent Documents 1, 2, the ripple counters are used as the counters, and subtraction is realized by inversion of the respective bits of the ripple counters. Further, the addition operation is realized by holding the count value of the first data and continuously operating the ripple counter for the next data. In this configuration, the CDS (Correlated Double Sampling) operation, which is often performed in an image sensor, is independently performed with respect to each column, and thus, the AD conversion results of the pixel outputs do not depend on the clock signals between the columns and the skew of the reference potential. As a result, the count operation can be performed using the faster clock signals. Further, addition and subtraction of the AD conversion results with respect to each column can be performed, and thus, there is an advantage that the addition operation of the pixel outputs within the same column may be performed on the AD conversion circuits.

SUMMARY

In order to improve the resolution in these circuits, raising of the frequency and taking time for processing are conceivable. Further, reduction of power consumption is also desired. Furthermore, with the spread of portable terminals, reduction in the circuit size is also desired.

Thus, it is desirable to control appropriate necessary resolution, and thereby, suppress power consumption without deterioration of performance.

An A/D converter according to an embodiment of the present disclosure switches resolution of m bits to resolution of n bits smaller than the m bits at a predetermined time.

The resolution may be switched to the resolution of n bits by partially stopping clock signals having plural phase differences to be supplied at the resolution of m bits at the predetermined time.

When the clock signals having plural phase differences at the resolution of m bits are supplied and the clock signals are stopped for switching to the resolution of n bits, at least one clock signal of the clock signals to be stopped may be stopped under a condition that a logical value is "1".

Lower bits according to the clock signal may be decoded in response to predetermined output within a ripple counter that counts upper bits.

The resolution may be switched to the resolution of n bits by partially stopping gray code counters to be supplied at the resolution of m bits at the predetermined time.

When plural gray codes are supplied at the resolution of m bits and the gray codes are stopped for switching of the resolution of n bits, at least one gray code of the gray codes to be stopped may be stopped under a condition that a logical value is "1".

The predetermined time may be a time into a white region.

The predetermined time may be a time into a region in which a change of 1 LSB is buried in noise.

The A/D converter may include a comparison unit that compares a reference voltage having a ramp waveform with a voltage value linearly changing with time to an input voltage, an upper bit counter that starts operation or stops operation with inversion of an output of the comparison unit as a trigger, and performing count with respect to each period of the clock signal, and a time quantization unit that outputs lower bits with the higher resolution than the period of the clock signal by latching phase information at a time when the output of a comparator is inverted using plural clock signals at different phases and decoding the value.

The A/D converter may include a comparison unit that compares a reference voltage having a ramp waveform with a voltage value linearly changing with time to an input voltage, an upper bit counter that starts operation or stops operation with inversion of an output of the comparator as a trigger, and performing count with respect to each period of the clock signals, and a lower bit counter that outputs lower bits by latching gray codes generated by the gray code counters from the clock signals and decoding the values.

A plurality of the A/D converters may be provided in an image sensor and the same control signals may be supplied thereto.

An A/D conversion method according to another embodiment of the present disclosure includes switching resolution of m bits to resolution of n bits smaller than the m bits at a predetermined time.

A program according to still another embodiment of the present disclosure is a computer-readable program for allowing a computer that controls an A/D converter for converting an analog signal into a digital signal to switch resolution of m bits to resolution of n bits smaller than the m bits at a predetermined time.

In the A/D converter, the A/D conversion method, and the program according to the embodiments of the present disclosure, the resolution of m bits is switched to the resolution of n bits smaller than m bits at the predetermined time.

According to the embodiments of the present disclosure, appropriate necessary resolution may be controlled. Further, by controlling the resolution, power consumption can be reduced.

BRIEF DESCRIPTION OF THE DRAWINGS

FIG. 6 is a diagram for explanation of the decode.

FIG. 7 is a diagram for explanation of decode values.

FIG. 11 is a diagram for explanation of decode.

FIG. 12 is a diagram for explanation of decode values.

FIG. 14 is a diagram for explanation of decode.

FIG. 15 is a diagram for explanation of a decode value.

FIG. 28 is a diagram for explanation of errors.

FIG. 31 is a diagram for explanation of errors.

FIG. 34 is a diagram for explanation of switching among operation modes.

FIG. 37 shows other details of the circuit shown in FIG. 3.

FIG. 45 is a diagram for explanation of errors.

FIG. 47 is a diagram for explanation of a recording medium.

DETAILED DESCRIPTION

Regarding First Embodiment

Figure 1:
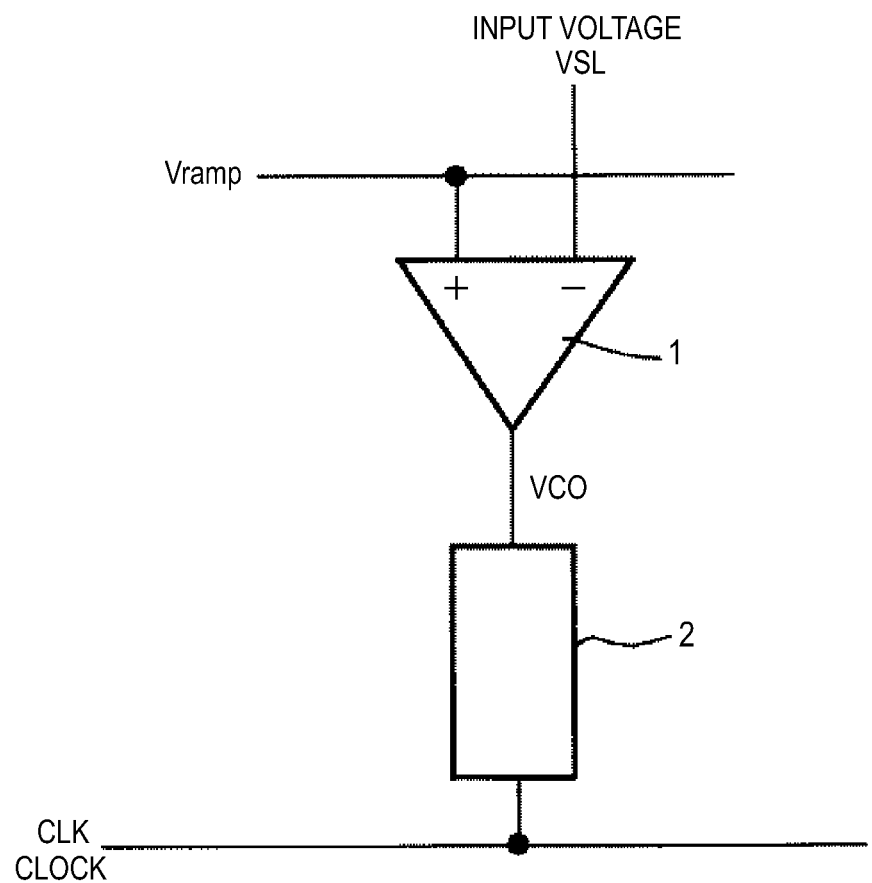
FIG. 1 is a diagram for explanation of a circuit having a comparator and a counter.
Figure 2:
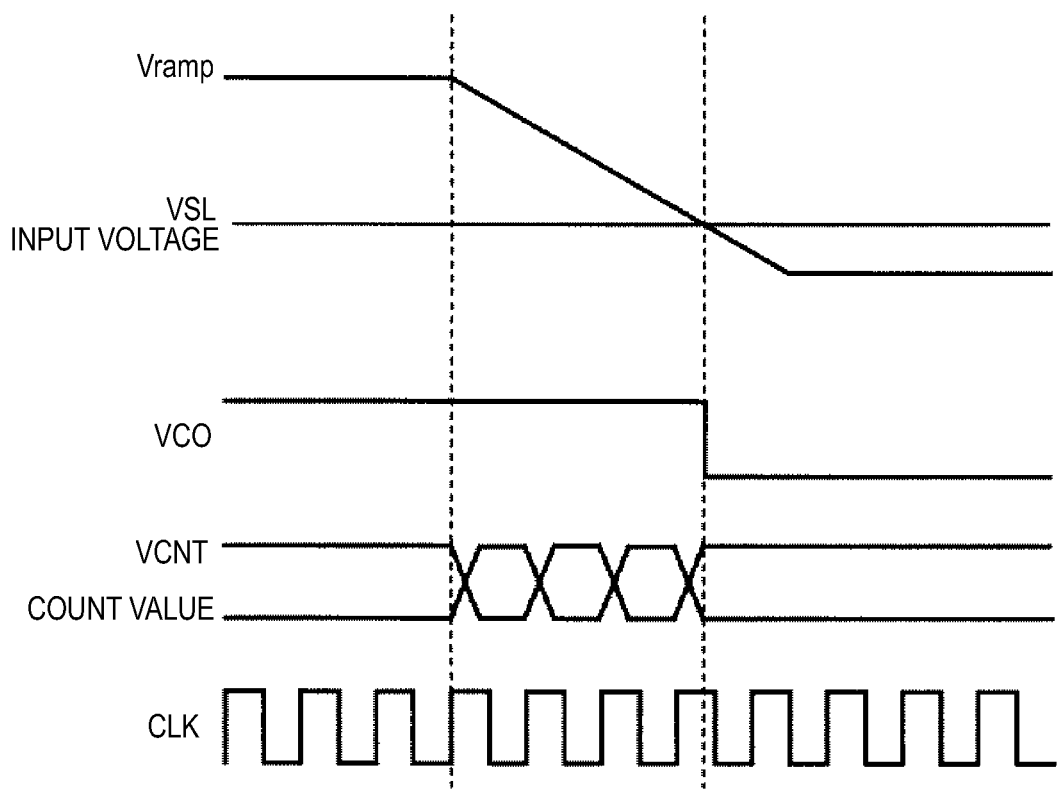
FIG. 2 is a diagram for explanation of an operation of the circuit having the comparator and the counter.
Figure 3:
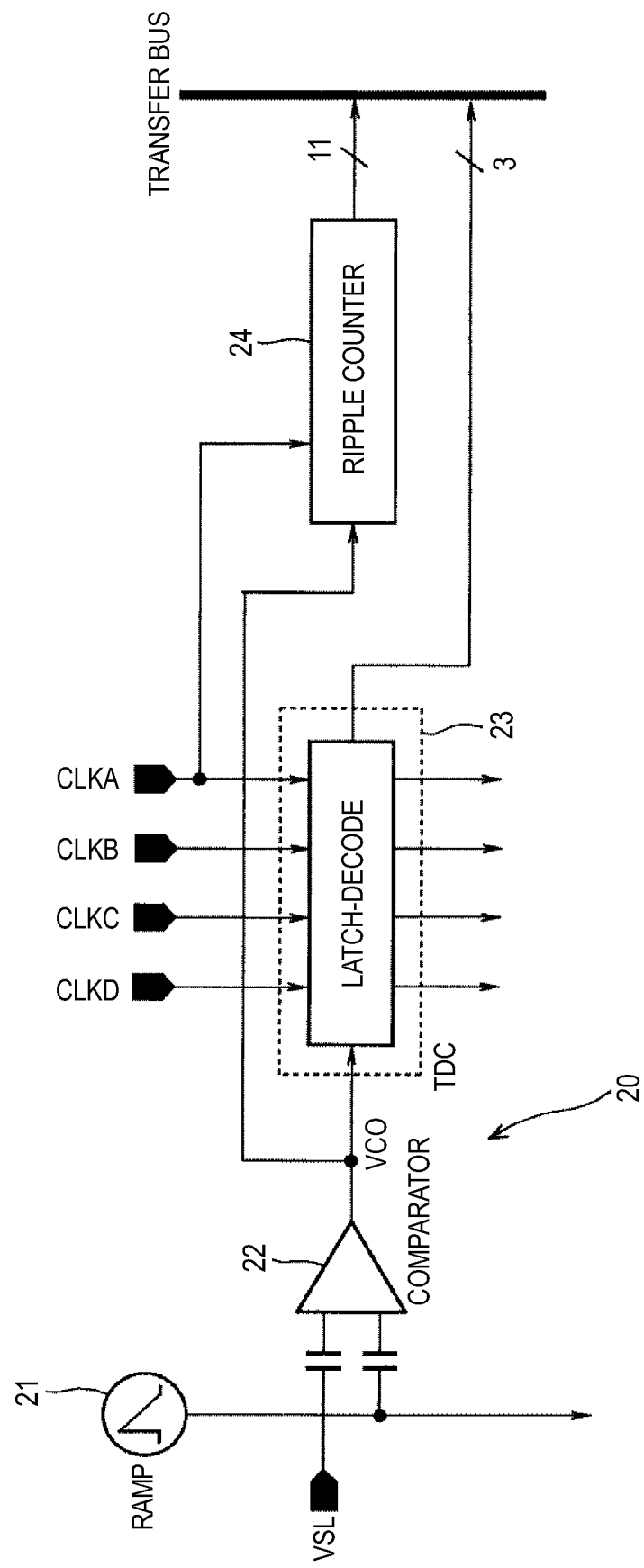
FIG. 3 shows a circuit having a latch, a decode, and a ripple counter.

FIG. 3 shows a configuration of one embodiment of an A/D converter (Analog Digital Converter). The A/D converter 20 has a reference voltage supply unit 21, a comparator 22, a latch-decode circuit 23, and a ripple counter 24. The latch-decode circuit 23 includes a latch circuit and a decode circuit.

The A/D converter 20 shown in FIG. 3 is an integrating A/D converter 20 that obtains information of the lower bits by an upper bit counter and a TDC (Time to Digital Converter) that latches and decodes clock signals at different phases. Here, as an example, the A/D converter 20 having resolution of 14 bits including a ripple counter of the upper 11 bits and the TDC of the lower 3 bits is shown.

The comparator 22 compares a reference voltage Vramp having a ramp waveform with a voltage value linearly changing with time supplied from the reference voltage supply unit 21 to an input voltage VSL, and outputs an output signal VCO at the level in response to the result to the latch-decode circuit 23 and the ripple counter 24.

When the level of the output signal VCO of the comparator 22 is inverted, the upper bits of the ripple counter 24 stop counting and the latch-decode circuit 23 latches phase information of the clock signals CLK and outputs latch data EB (extension code EB). A clock signal CLKA, a clock signal CLKB, a clock signal CLKC, a clock signal CLKD at different phases by 45 degrees are supplied to the latch-decode circuit 23, and the phase information is latched by the respective clock signals.

These clock signals are supplied from a supply unit (not shown), and the clock signals supplied from the supply unit are supplied to the latch-decode circuit 23 under control of a control unit (not shown). As will be described later, supply of the clock signals is stopped when a predetermined region (for example, a white region) is determined, and the determination is performed by the control unit.

The latch-decode circuit 23 converts latch information into pulse (train) and the pulse is output as a count clock signal of the ripple counter 24. The ripple counter 24 converts the phase information of the clock signals into binary codes as the least significant bit of the ripple counter in response to the count clock signal of the latch-decode circuit 23.

Figure 4:
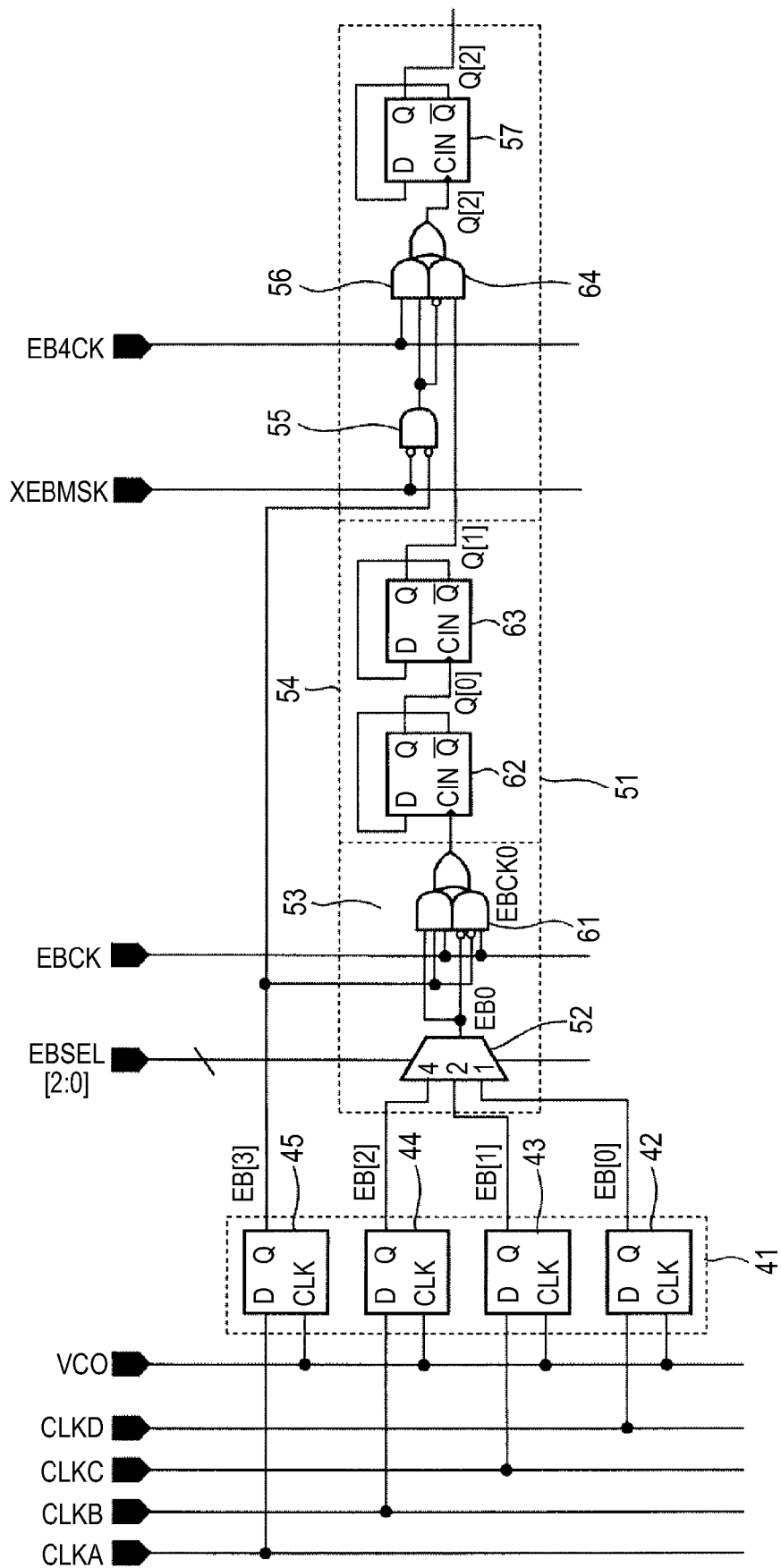
FIG. 4 shows details of the circuit shown in FIG. 3.

FIG. 4 shows the detailed configuration of the latch-decode circuit 23 of the A/D converter 20 shown in FIG. 3. The latch-decode circuit 23 shown in FIG. 4 is a circuit of converting the extension codes into binary values. The latch-decode circuit 23 shown in FIG. 4 includes a latch circuit 41 and a decode circuit 51, and the latch circuit 41 includes flip-flops 42 to 45. The decode circuit 51 has a selector 52, a first decode circuit 53, a first ripple counter part 54, a mask circuit 55, a second decode circuit 56, a second ripple counter part 57.

The comparator 22 (FIG. 3) compares the reference voltage Vramp having the ramp waveform with the voltage value linearly changing with time to the input voltage VSL, and outputs the output signals VCO at the levels in response to the results to the respective flip-flops 42 to 45 of the latch circuit 41.

The latch circuit 41 has the flip-flops 42, 43, 44 as a first latch and the flip-flop 46 as a second latch. The latch circuit 41 latches the phase information at the time when the output signal VCO of the comparator 22 is inverted using the plural clock signals at different phases. In the embodiment, the four clock signals including the clock signal CLKB, the clock signal CLKC, the clock signal CLKD at phases sequentially shifted by 45 degrees with reference to the clock signal CLKA, and the clock signal CLKA itself are used as the plural clock signals at different phases. The phase shift of 45 degrees corresponds to 1/8 of a clock signal period Tck.

The respective flip-flops 42 to 45 latch the phase information of the clock signal CLKA, the clock signal CLKB, the clock signal CLKC, and the clock signal CLKD in synchronization with the output signals VCO of the comparator 22. The flip-flop 42 latches the clock signal CLKD in synchronization with the output signal VCO of the comparator 22. The extension code EB[0] is obtained from Q-output of the flip-flop 42, and the flip-flop 42 outputs the obtained extension code EB[0] to the selector 52.

The flip-flop 43 latches the phase information of the clock signal CLKC in synchronization with the output signal VCO of the comparator 22. The extension code EB[1] is obtained from Q-output of the flip-flop 43, and the flip-flop 43 outputs the obtained extension code EB[1] to the selector 52. The flip-flop 44 latches the phase information of the clock signal CLKB in synchronization with the output signal VCO of the comparator 22. The extension code EB[2] is obtained from Q-output of the flip-flop 44, and the flip-flop 44 outputs the obtained extension code EB[2] to the selector 52.

The flip-flop 45 latches the phase information of the clock signal CLKA in synchronization with the output signal VCO of the comparator 22. The extension code EB[3] is obtained from Q-output of the flip-flop 45, and the flip-flop 45 outputs the obtained extension code EB[3] to the first decode circuit 53 and the mask circuit 55.

The selector 52 sequentially selects the extension code EB[0], the extension code EB[1], the extension code EB[2] output from the flip-flops 42 to 44 in response to selector signals EBSEL[2:0], and outputs them as signals EBO to the first decode circuit 53. The first decode circuit 53 converts the extension codes EB[0] to EB[2] as latch information of the latch circuit 41 into pulse (train) in response to a pulse signal EBCK and the extension code EB[3], and outputs the pulse signal EBCKO as a count clock signal of the first ripple counter part 54.

The first decode circuit 53 has an AND-OR circuit 61 including two AND circuits and one OR circuit. The first input terminal of the first three-input AND circuit of the AND-OR circuit 61 is connected to the supply line of the pulse signal EBCK. The second negative input terminal of the first three-input AND circuit is connected to the output line of the extension code EB[3], and the third negative input terminal is connected to the supply line of the signal EBO of the selector 52.

The first input terminal of the second three-input AND circuit of the AND-OR circuit 61 is connected to the supply line of the pulse signal EBCK. The second input terminal of the second three-input AND circuit is connected to the output line of the extension code EB[3], and the third input terminal is connected to the supply line of the signal EBO of the selector 52. The outputs from the first three-input AND circuit and the second three-input AND circuit are respectively supplied to the OR circuit. Further, the output from the OR circuit is supplied to the first ripple counter part 54.

The first ripple counter part 54 converts the phase information of the clock signals into binary codes as lower bits in response to the count clock signal of the first decode circuit 53. The first ripple counter part 54 has cascade-connected flip-flop 62 and flip-flop 63 as memory devices. The terminal CIN of the flip-flop 62 is connected to the supply line of the pulse signal EBCKO of the first decode circuit 53, the input D is connected to the inverted output/Q ("/" indicates inversion), and the output Q is connected to the terminal CIN of the flip-flop 63. The D-input of the flip-flop 63 is connected to the inverted output/Q and the output Q is connected to the second decode circuit 56.

The mask circuit 55 performs mask processing of determining whether the extension code EB[3] by the latch circuit 41 is input or not to the second decode circuit 56 in response to a mask signal XEBMSK and processing it. The mask circuit 55 includes a negative two-input AND circuit. The first negative input terminal of the AND circuit of the mask circuit 55 is connected to the supply line of the extension code EB[3] of the latch circuit 41, and the second negative input terminal is connected to the supply line of the mask signal XEBMSK at the low active level.

The second decode circuit 56 converts the extension code EB[3] of the latch circuit 41 into pulse (train) in response to a pulse signal EB4CK, and outputs the signal Q[2] as the count clock signal of the second ripple counter part 57.

The second decode circuit 56 has an AND-OR circuit 64 including two AND circuits and one OR circuit. The first input terminal of the first two-input AND circuit of the AND-OR circuit 64 is connected to the supply line of the pulse signal EB4CK, and the second input terminal is connected to the output terminal of the mask circuit 55. The first negative input terminal of the second two-input AND circuit of the AND-OR circuit 64 is connected to the output terminal of the mask circuit and the second input terminal is connected to the output line of the output Q[1] of the first ripple counter part 54. The output of the first two-input AND circuit and the output of the second AND circuit are supplied to the OR circuit, and the output signal Q[2] from the OR circuit is supplied to the second ripple counter part 57.

The second ripple counter part 57 converts the phase information of the clock signals into binary codes as higher bits of the ripple counter in response to the count clock signal of the second decode circuit 56. The second ripple counter part 57 has a flip-flop 57 and a ripple counter 24 (FIG. 3). The input D of the flip-flop 57 is connected to the inverted output/Q ("/" indicates inversion), the terminal CIN is connected to the supply line of the output signal Q[2] of the second decode circuit 56, and the output Q is connected to the input terminal of the ripple counter 24 (FIG. 3). The flip-flop 57 functions as a memory device (latch) after binary conversion.

Figure 5:
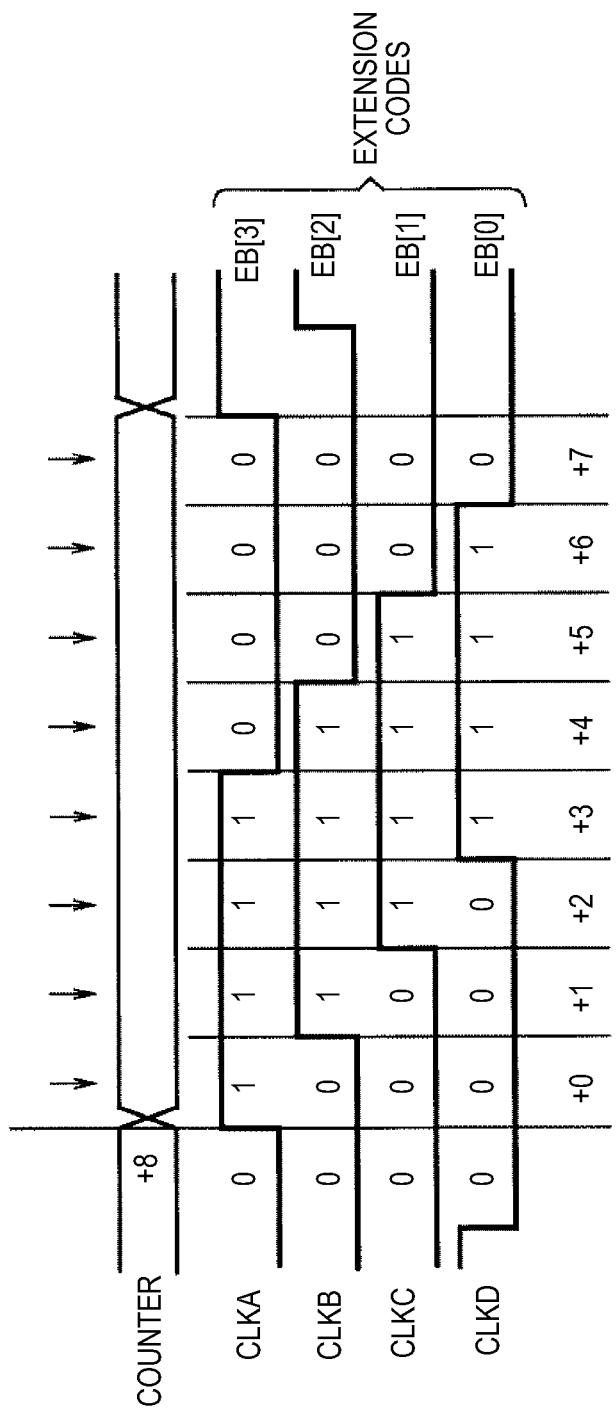
FIG. 5 is a diagram for explanation of an operation of the circuit shown in FIG. 4.

FIG. 5 shows a timing chart for explanation of an operation of the A/D converter 20 in FIG. 4, FIG. 6 shows an algorithm for conversion of extension codes into binary values, and FIG. 7 shows an example of decoding results of the extension codes EB[3:0] into binary values.

FIG. 5 shows the case of the four clock signals at phases shifted by 1/8 Tck (Tck is a clock signal period). The period of the clock signal is equally divided into eight by the combinations of 0/1 of the four clock signals CLKA to CLKD. In the first period from 0 to 1/8 Tck, the clock signals CLK[3:0]=1000b, in the next period from 1/8 Tck to 2/8 Tck, the clock signals CLK[3:0]=1100b, . . . . By dividing the phase of the clock signal CLK into eight, information of 3b in binary codes may be obtained.

At the moment when the output signal VCO of the comparator 22 changes from the high level (H) to the low level (L), the clock signals CLK[3:0] are latched and the latch data is the extension codes EB[3:0]. Given that the first period from 0 to 1/8 Tck of the clock signal is converted into "0", the period from 1/8 Tck to 2/8 Tck is converted into "1", and subsequently, the periods are converted into count values of 2, 3, 4, ..., the pulses in the numbers having the correspondence relationships as shown in FIG. 7 are generated.

In a 3-bit TDC, if extension code EB[3]=1, the number of "1" of the extension codes EB[2:0] is a corresponding numeric value, and, if extension code EB[3]=0, the number of "0" of the extension codes EB[2:0] and the number obtained by adding "4" thereto are corresponding numeric values. According to the algorithm, with reference to FIG. 7, if the extension codes EB[3], EB[2], EB[1], EB[0] are "1, 0, 0, 0", the binary code is "000" and the decode value is "0". Similarly, if the extension codes EB[3], EB[2], EB[1], EB[0] are "1, 1, 0, 0", the binary code is "001" and the decode value is "1".

If the extension codes EB[3], EB[2], EB[1], EB[0] are "1, 1, 1, 0", the binary code is "010" and the decode value is "2". If the extension codes EB[3], EB[2], EB[1], EB[0] are "1, 1, 1, 1", the binary code is "011" and the decode value is "3". If the extension codes EB[3], EB[2], EB[1], EB[0] are "0, 1, 1, 1", the binary code is "100" and the decode value is "4".

If the extension codes EB[3], EB[2], EB[1], EB[0] are "0, 0, 1, 1", the binary code is "101" and the decode value is "5". Similarly, if the extension codes EB[3], EB[2], EB[1], EB[0] are "0, 0, 0, 1", the binary code is "110" and the decode value is "6". If the extension codes EB[3], EB[2], EB[1], EB[0] are "0, 0, 0, 0", the binary code is "111" and the decode value is "7". In this manner, the extension codes are converted into the decode values.

[Regarding Processing for Reducing Power Consumption]

Since the A/D converter circuit 20 operates in the above described manner, A/D conversion with improved resolution using extension codes can be performed. For example, according to a digital camera including the A/D converter circuit 20, improvements in image quality because of higher resolution may be expected. That is, as the resolution is higher, the quality of data in the device including the A/D converter circuit 20, for example, image quality or sound quality can be improved. In the following explanation, mainly, the case where the A/D converter circuit in the embodiment is applied to devices that handle images and videos such as a digital camera will be exemplified, and processing for reducing power consumption without deterioration of image quality will be explained.

As described above, the four clock signals are input to the latch-decode circuit 23. By stopping the clock signals, the power consumption may be reduced. However, when the clock signals are stopped, the resolution becomes lower. Accordingly, conditions having little (negligible) influence even when the clock signals are stopped and the resolution becomes lower will be explained.

Figure 8:
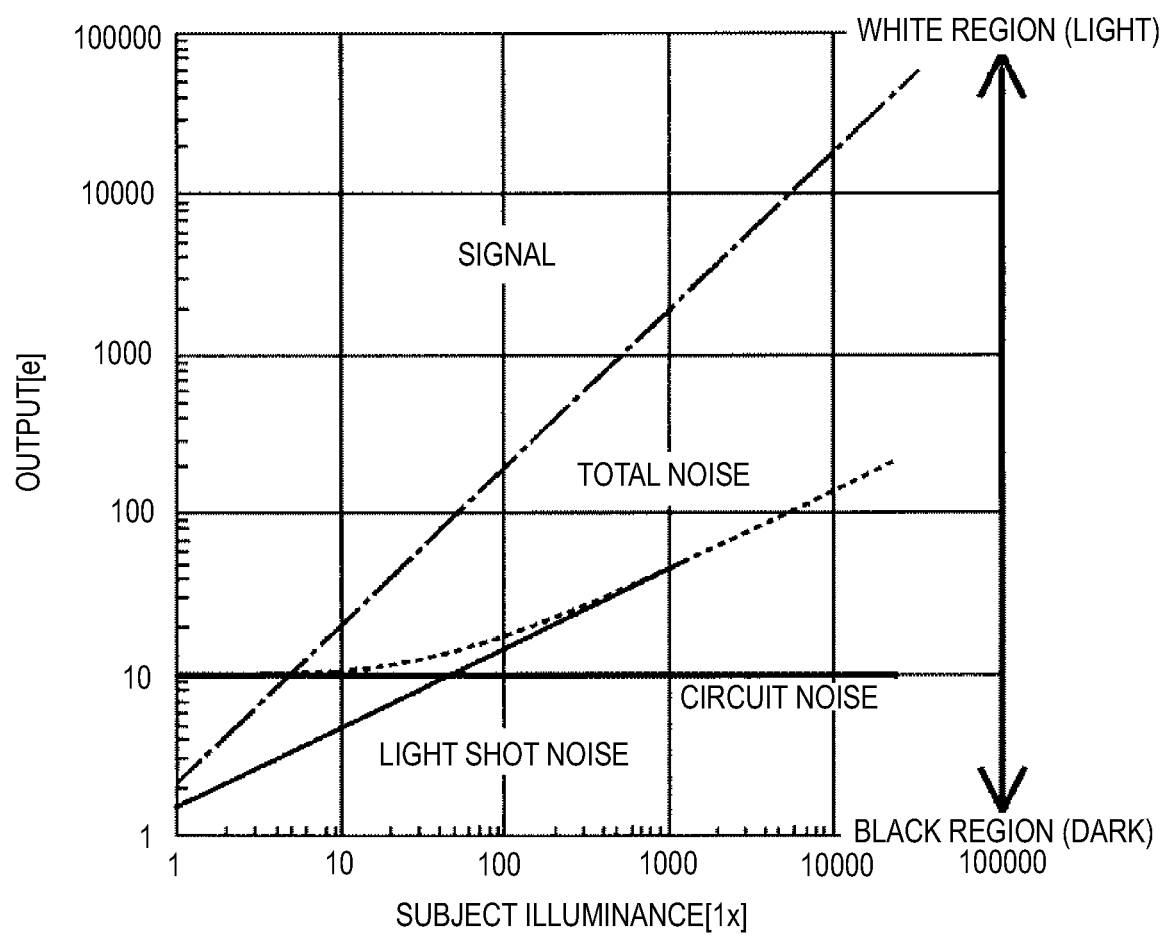
FIG. 8 is a diagram for explanation of a region in which stopping of clocks is executed.

FIG. 8 is a graph showing relations between illuminance of light entering an image sensor and the number of electrons generated within the pixels of the image sensor. At the lower illuminance, i.e., in the black region, the circuit noise as a fixed component is dominating and the signal component proportional to the amount of light is smaller. On the other hand, at the higher illuminance, i.e., in the white region, the light shot noise proportional to the square of the illuminance is dominating.

Given that the number of electrons generated by the incident light is Q[e−], the light shot noise is defined by the following equation (1).

$$\text{Light Shot Noise} = \sqrt{Q}[e-] \quad (1)$$

Given that the conversion efficiency into a voltage signal is E[V/e−], the light shot noise is defined by the following equation (2).

$$\text{Light Shot Noise} = E\sqrt{Q}[Vrms] \quad (2)$$

Here, given that the circuit noise of the fixed component due to a readout circuit is Nc [$V_{rms}$] and the total amount of noise N [$V_{rms}$] is expressed as a function of the number of electrons Q, the following equation (3) and equation (4) are obtained.

$$N(Q)^2 = (E\sqrt{Q})^2 + Nc^2 \quad (3)$$

$$N(Q) = \sqrt{E^2 Q + Nc^2} \quad (4)$$

Figure 9:
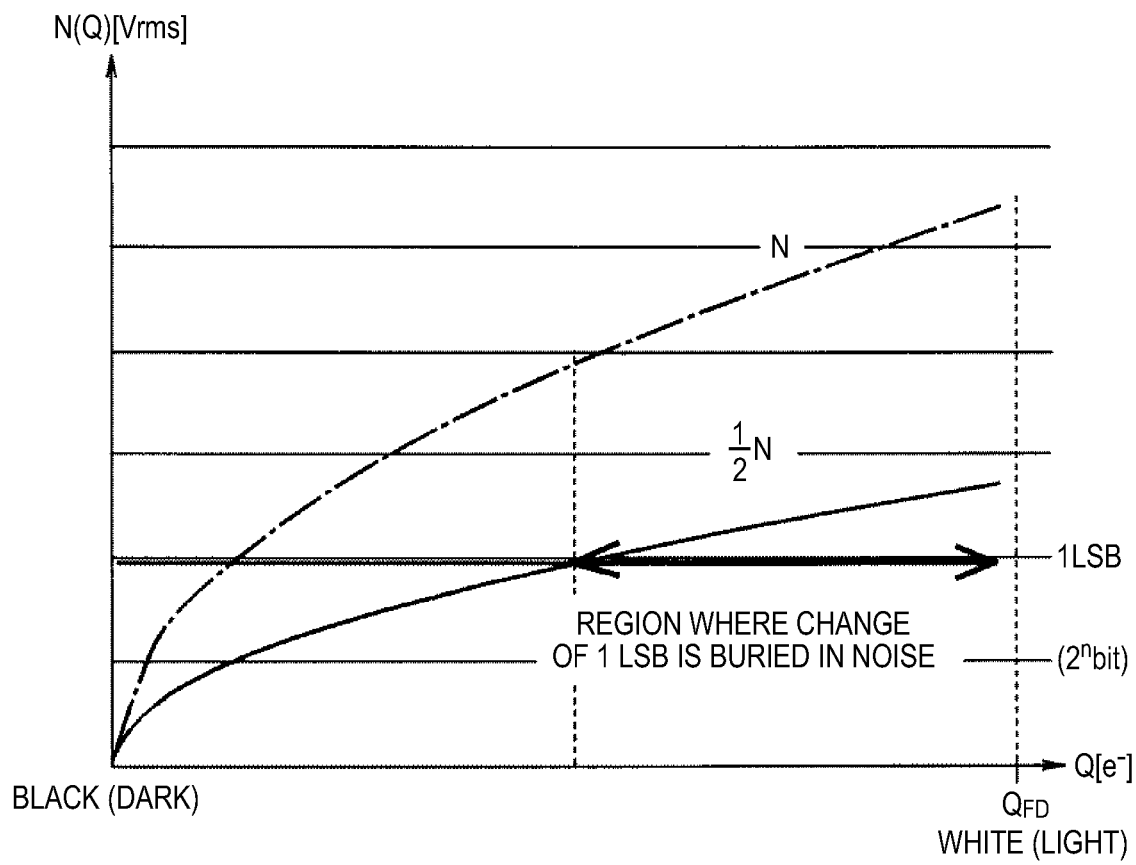
FIG. 9 is a diagram for explanation of the region in which stopping of clocks is executed.

The graph in FIG. 9 is a graph showing relations with the number of photoelectrons Q [−e] on the horizontal axis and the total amount of noise N [$V_{rms}$] on the vertical axis. In FIG. 9, the $Q_{FD}$[−e] is saturated capacity of the pixel. Further, the dynamic range of the image sensor is $D_{RANGE}$ [V] and the resolution of the A/D converter is n [bit]. In this case, the weight of 1 LSB (least significant bit), i.e., the voltage width changing by the 1 LSB is expressed by the following equation (5).

$$\text{Voltage Width } D_{RANGE}/2^n \quad (5)$$

FIG. 9 shows a curve of the total amount of noise N and a curve of a half of the total amount of noise (1/2)N. Here, when the voltage width $D_{RANGE}/2^n$ of 1 LSB is smaller than the half of the total amount of noise N/2, the change of 1 LSB is buried in the noise, and the resolution of n [bit] of the A/D converter may not necessarily be required in the region (for example, the white region). In the region in which the resolution is buried in the noise, it is not necessary to maintain the resolution for maintenance of image quality and the resolution may be n bits or less.

As described above, the A/D converter circuit 20 raises the resolution by inputting the four clock signals to the latch-decode circuit 23 and processing them to create the lower three bits, and the power consumption of the A/D converter circuit 20 may be reduced by stopping the clock signals in a range that does not affect the image quality. In other words, the lower power consumption of the entire A/D converter 20 is realized by focusing attention on a region where the highest resolution of the A/D converter 20 is not necessary in the part with high illuminance, for example, in the white region, and reducing the resolution of the A/D converter 20 in the region.

Note that, the condition that the resolution is buried in the noise is not limited to the above described condition because it is determined through an image quality evaluation or the like. That is, in the above described example, the condition that the voltage width $D_{RANGE}/2^n$ of 1 LSB is smaller than the half of the total amount of noise N/2 is set, however, not only the half of the total amount of noise but also other values such as a third or fifth of the total amount may be used.

The decode value when the clock signal input to the latch-decode circuit 23 is stopped in the A/D converter circuit 20 will be explained. With reference to FIGS. 5 to 7, the decode values when the clock signals are not stopped, i.e., in the operation mode of operation as a 3-bit TDC in which three binary codes are obtained has been explained. Similarly, as below, decode values when two clock signals are stopped in an operation mode of operation as a 2-bit TDC in which two binary codes are obtained, and decode values when three clock signals are stopped in an operation mode of operation as a 1-bit TDC in which one binary code is obtained will respectively be explained.

[Regarding Operation Mode of 2-Bit TDC]

Figure 10:
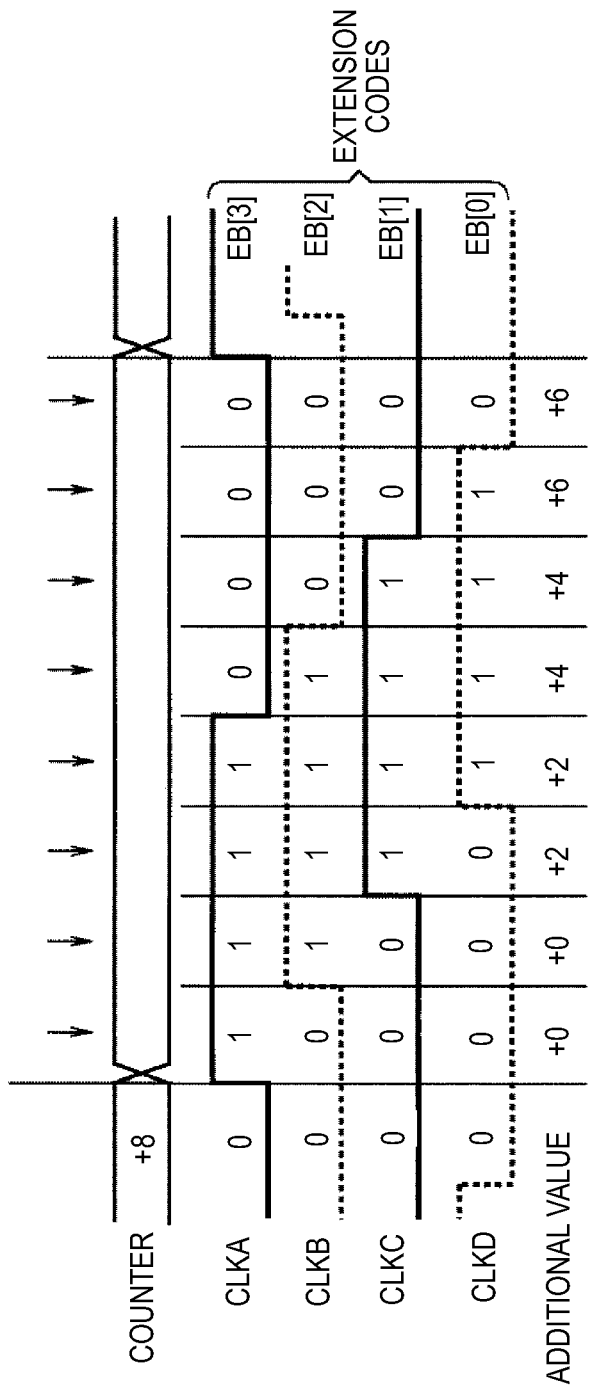
FIG. 10 is a diagram for explanation of an operation of the circuit shown in FIG. 4.
Figure 11:
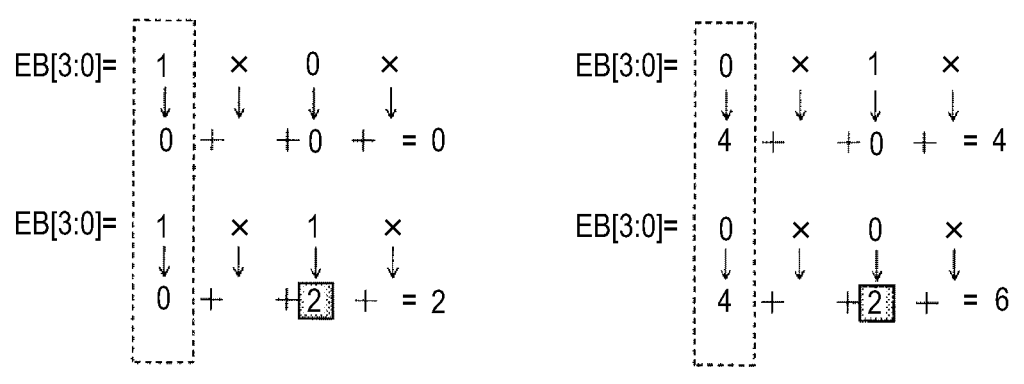

FIG. 10 is a timing chart for explanation of an operation of the A/D converter 20 in FIG. 4, and the timing chart in which two clock signals of the four clock signals input to the latch-decode circuit 23 are stopped and the circuit functions as a 2-bit TDC. FIG. 11 shows an algorithm of converting extension codes into binary values. FIG. 12 shows an example of decoding results of the extension codes EB[3:0] into binary values.

The four signals at phases shifted by 1/8 Tck (Tck is a clock signal period) are input to the latch-decode circuit 23, and the timing chart is when the two clock signals of them operate. FIG. 10 shows the timing chart when the clock signal CLKA and the clock signal CLKC operate and the clock signal CLKB and the clock signal CLKD are stopped. Further, in FIG. 10, the dotted lines show that the clock signals are stopped.

In the operation mode of the 2-bit TDC, if the EB[3] itself is "1", its count is "0" and, if the EB[3] is "0", its count is "4". Regarding the EB[1], if the EB[3] is "1", the count is twice the number of the logical values "1" and, if the EB[3] is "0", the count is twice the number of the logical values "0", respectively. That is, if extension code EB[3]=1, the number of "1" of the extension codes EB[1:0] is a corresponding numeric value and, if extension code EB[3]=0, the number of "0" of the extension codes EB[1:0] and four is added thereto are corresponding numeric values.

According to the algorithm, the first period from 0 to 2/8 Tck of the clock signal period is converted into the count value of "0", the period from 3/8 Tck to 4/8 Tck of the clock signal period is converted into the count value of "2", the period from 5/8 Tck to 6/8 Tck of the clock signal period is converted into the count value of "4", the period from 7/8 Tck to 8/8 Tck of the clock signal period is converted into the count value of "6", and pulses in the numbers having the correspondence relations as shown in FIG. 12 are generated.

If the extension codes EB[3], EB[1] are "1, 0", the binary code is "000" and the decode value is "0". If the extension codes EB[3], EB[1] are "1, 1", the binary code is "010" and the decode value is "2". If the extension codes EB[3], EB[1] are "0, 1", the binary code is "100" and the decode value is "4". If the extension codes EB[3], EB[1] are "0, 0", the binary code is "110" and the decode value is "6".

In this case, in one period of the clock signal, the values of the two clock signals CLKA, CLKC at different phases by 90 degrees are latched at the times when the output signal VCO changes, and four pairs of extension codes EB[3], EB[1] are obtained. By decoding the four pairs of codes, information of the lower 2 bits may be obtained, and this can be shown as in FIG. 12.

Here, compared to the 3-bit TDC, it is known that the number of clock signals necessary for acquisition of the phase information is smaller by two. This means that, by reducing the resolution of 1 bit, the operation of the two clock signals is no longer necessary. It is clear that, if the two clock signals are not operated, the power to be consumed may be reduced by the amount.

[Regarding Operation Mode of 1-Bit TDC]

Figure 13:
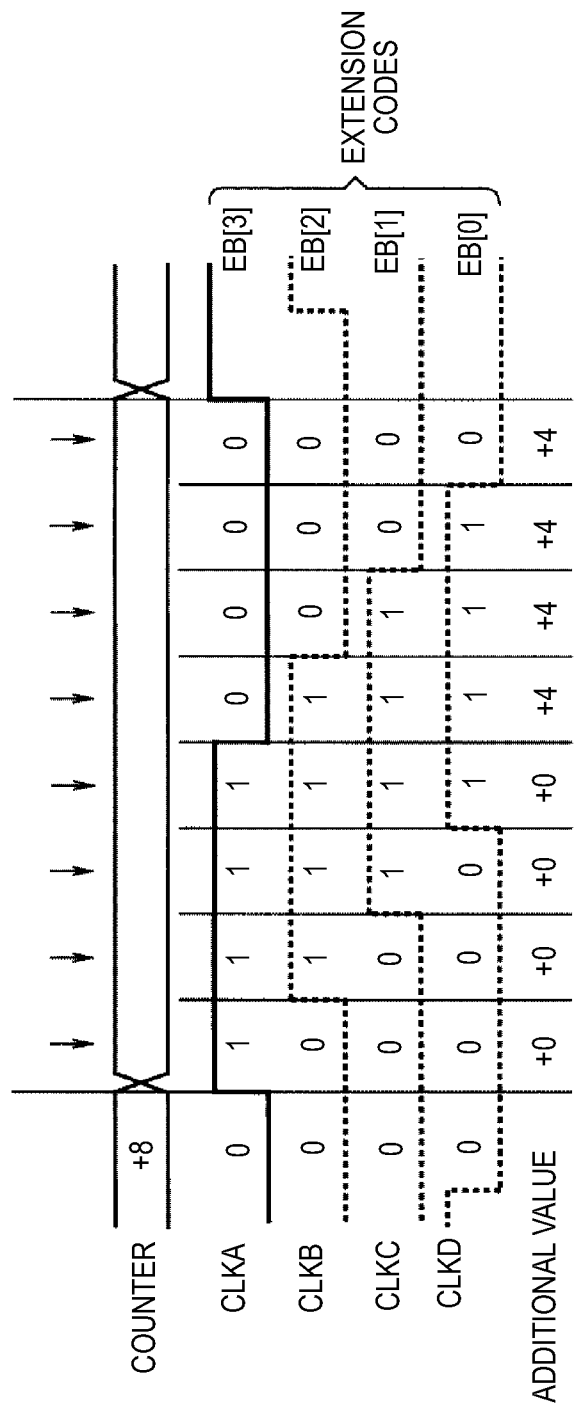
FIG. 13 is a diagram for explanation of an operation of the circuit shown in FIG. 4.
Figure 14:
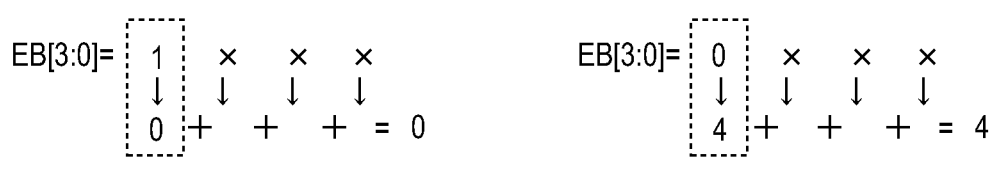
Figure 15:
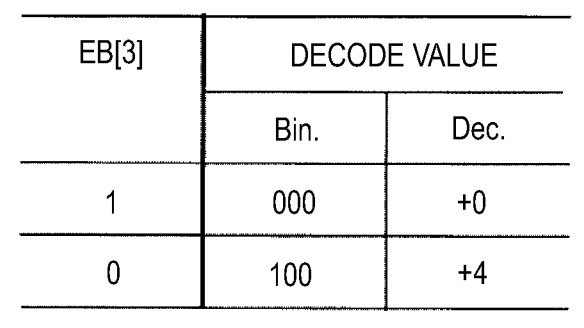

FIG. 13 is a timing chart for explanation of an operation of the A/D converter 20 in FIG. 4, and the timing chart in which three clock signals of the four clock signals input to the latch-decode circuit 23 are stopped and the circuit functions as a 1-bit TDC. FIG. 14 shows an algorithm of converting extension codes into binary values. FIG. 15 shows an example of decoding results of the extension codes EB[3:0] into binary values.

The four signals at phases shifted by 1/8 Tck (Tck is a clock signal period) are input to the latch-decode circuit 23, and the timing chart is that when the one clock signal of them operates. FIG. 13 shows the timing chart when the clock signal CLKA operates and the clock signal CLKB, the clock signal CLKC, and the clock signal CLKD are stopped. Further, in FIG. 13, the dotted lines show that the clock signals are stopped.

In the operation mode of the 1-bit TDC, if the EB[3] itself is "1", its count is "0" and, if the EB[3] is "0", its count is "4". That is, if the extension code EB[3]=1, the count is "0" and, if the EB[3]=0, the count is "4".

According to the algorithm, the first period from 0 to 4/8 Tck of the clock signal period is converted into the count value of "0", the period from 5/8 Tck to 8/8 Tck of the clock signal period is converted into the count value of "4", and pulses in the numbers having the correspondence relations as shown in FIG. 15 are generated. If the extension code EB[3] is "1", the binary code is "000" and the decode value is "0". If the extension code EB[3] is "1", the binary code is "100" and the decode value is "4".

In this case, only one clock signal CLKA is necessary, and the extension code EB[3] is obtained with two levels of Hi or Lo of the clock signal as the phase information. By decoding the two codes, information of the lower 1 bit may be obtained.

Here, compared to the 2-bit TDC, it is known that the number of clock signals necessary for acquisition of the phase information is smaller by one. Further, compared to the 3-bit TDC, it is known that the number of clock signals necessary for acquisition of the phase information is smaller by three. It is clear that, if the three clock signals are not operated, the power to be consumed may be reduced by the amount.

In this manner, by stopping the clock signals, the resolution becomes lower. However, by appropriately timing the stopping of the clock signals, the power consumption can be reduced without deterioration of the image quality due to reduction of the resolution. The time when the clock signal is stopped is, for example, when the voltage width $D_{RANGE}/2^n$ of 1 LSB is smaller than the half of the total amount of noise N/2 as described above. Even when the clock signal is stopped in the area and the resolution is reduced, decoding may be performed without any substantial influence on the image quality.

[Regarding Switching among Operation Modes]

The case where the latch-decode circuit 23 is used by switching in the order of the 3-bit TDC, 2-bit TDC, 1-bit TDC, in other words, the case where the latch-decode circuit 23 is switched from an operation mode of operating four clock signals to an operation mode of operating two clock signals, and further switched to an operation mode of operating one clock signal will be explained with reference to FIG. 16.

Figure 16:
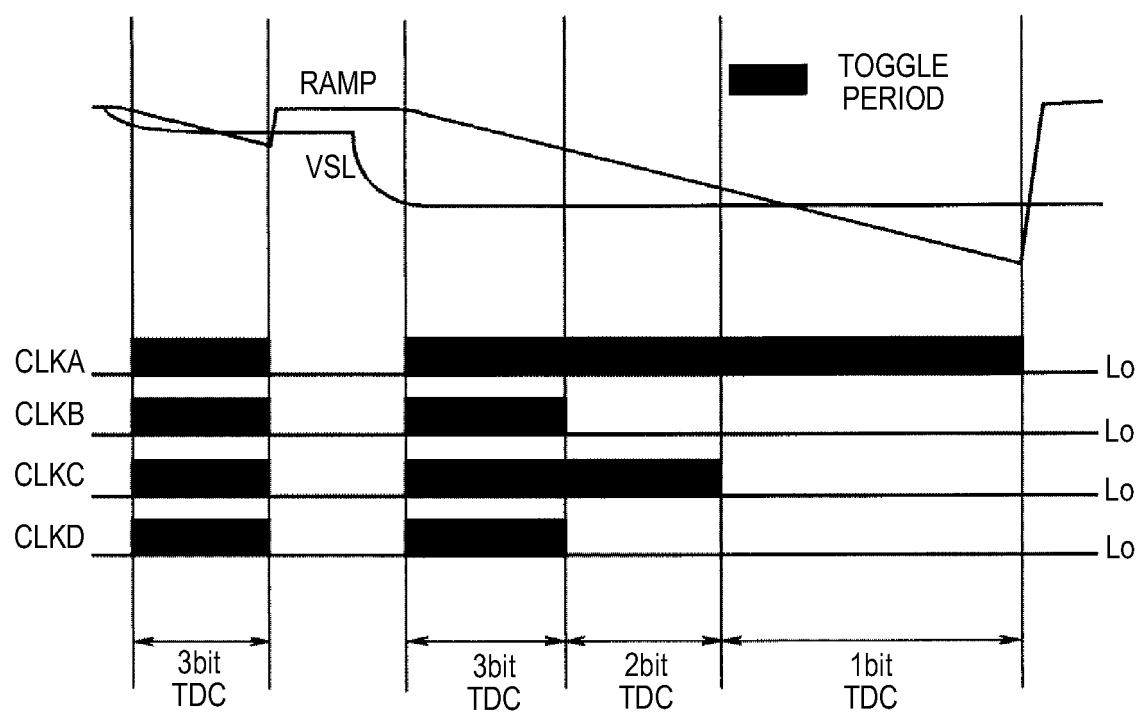
FIG. 16 is a diagram for explanation of switching among operation modes.

FIG. 16 shows an A/D conversion period and operation periods of four clock signals. In the first half of the A/D conversion period, counting is performed at the higher potential of the pixel output VSL (lower illuminance) and, in the second half of the A/D conversion period, counting is performed at the lower VSL potential (higher illuminance). In the A/D conversion period, the circuit is operated as the 3-bit TDC with higher resolution in the black region with lower illuminance, and, concurrently, the four clock signals CLKA, CLKB, CLKC, CLKD are operated. From the region where the resolution may be reduced, the two clock signals CLKB, CLKD are stopped, and the circuit is operated as the 2-bit TDC. Further, the one clock signal CLKC is stopped, and the circuit is operated as the 1-bit TDC.

By sequentially stopping the clock signals in this manner, the current consumption may be reduced at least by the stopped clock signals in the case where the clock signals CLKB, CLKC, CLKD are stopped and the circuit functions with resolution of n bits compared to the case where the four clock signals are constantly operated and the circuit functions with resolution of m bits. Further, by stopping the clock signals in the white region, the substantial deterioration of image quality is not caused even when the clock signals are stopped and the resolution is reduced.

[Regarding Possibility of Failure by Stopping Clocks]

Figure 17A:
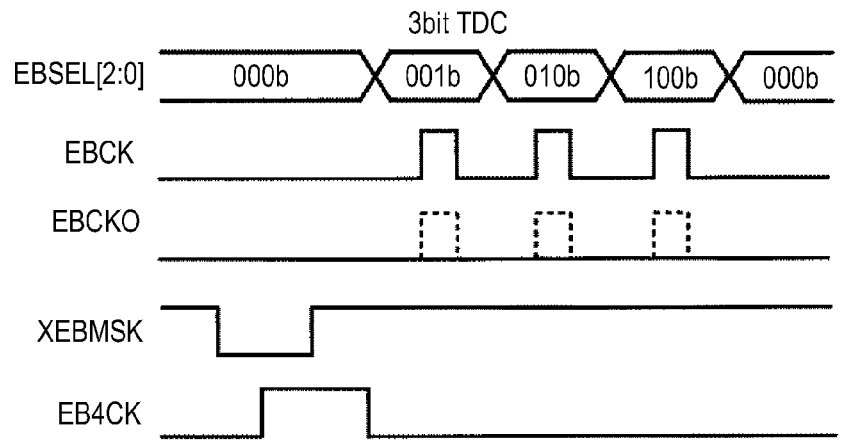
FIGS. 17A to 17C are diagrams for explanation of operations in the respective operation modes.
Figure 17B:
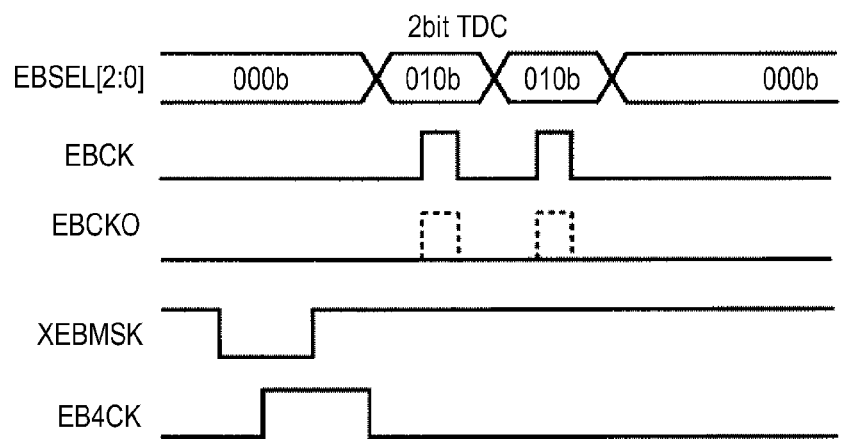
Figure 17C:
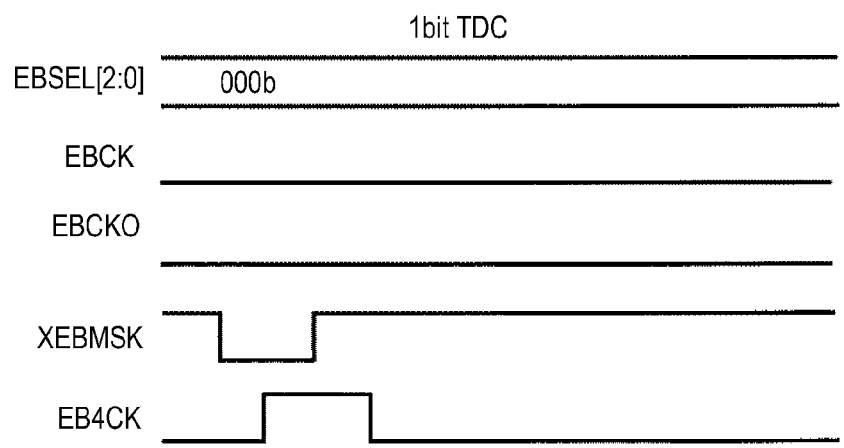

However, by sequentially stopping the clock signals in this manner, linearity may be deteriorated and monotonic increasing characteristics may be lost. Before the explanation of the reason, control signals supplied to the A/D converter circuit 20 will be explained. FIGS. 17A to 17C show waveforms of the control signals. FIG. 17A shows a waveform when the latch-decode circuit 23 functions as a 3-bit TDC, and FIG. 17B shows a waveform when the circuit functions as a 2-bit TDC, and FIG. 17C shows a waveform when the circuit functions as a 1-bit TDC.

The pulse of the control signal EBCK is a signal source for driving the counter. The control signal EBCKO is a pulse representing whether the pulse of the control signal EBCK is passed or not, and the pulse for control to pass the pulse when the count is necessary and not to pass the pulse when the count is unnecessary according to the combination of the values of extension codes. The passing pulse actually drives the counter as a count clock signal. A control signal XEBMSK is a control signal for performance of mask processing of determining whether the extension code EB[3] by the latch circuit 41 is input or not to the second decode circuit 56. A control signal EB4CK is a control signal for conversion of the extension code EB[3] of the latch circuit 41 into pulse (train) in response to the pulse of the control signal EB4CK and output of the signal D[2] as a count clock signal of the second ripple counter part 57.

In FIGS. 17A to 17C, if the EB[3] itself is "1", its count is "0" and, if the EB[3] itself is "0", its count is "4", and accordingly, regarding the EB[3], the control pulse is directly sent to the ripple counter of the third bit (the flip-flop 57 having the output of Q[2]) by the control signal XEBMSK and the control signal EB4CK.

In the case of the 3-bit TDC, regarding the EB[2:0], the flip-flops 62,63 storing the respective extension codes are accessed at the EBSEL[2:0], and the control signal EBCK generates clock signal pulses one by one at the same time. By the value of the EB[3] and the values of the accessed EB[2:0], the number of logical values is sent to the ripple counter of the first or second bit (the flip-flop 62, 63 having the output of Q[0], Q[1]) depending on whether the pulse of the control signal EBCKO is passed or not.

As shown in FIG. 17B, in the case of the 2-bit TDC, the logical value of the EB[1] is counted twice, and the access to the EB[1] by the EBSEL[1] is performed twice and counted twice. As shown in FIG. 17C, in the case of the 1-bit TDC, there is no access to the EB[2:0] by the EBSEL[2:0].

Figure 18:
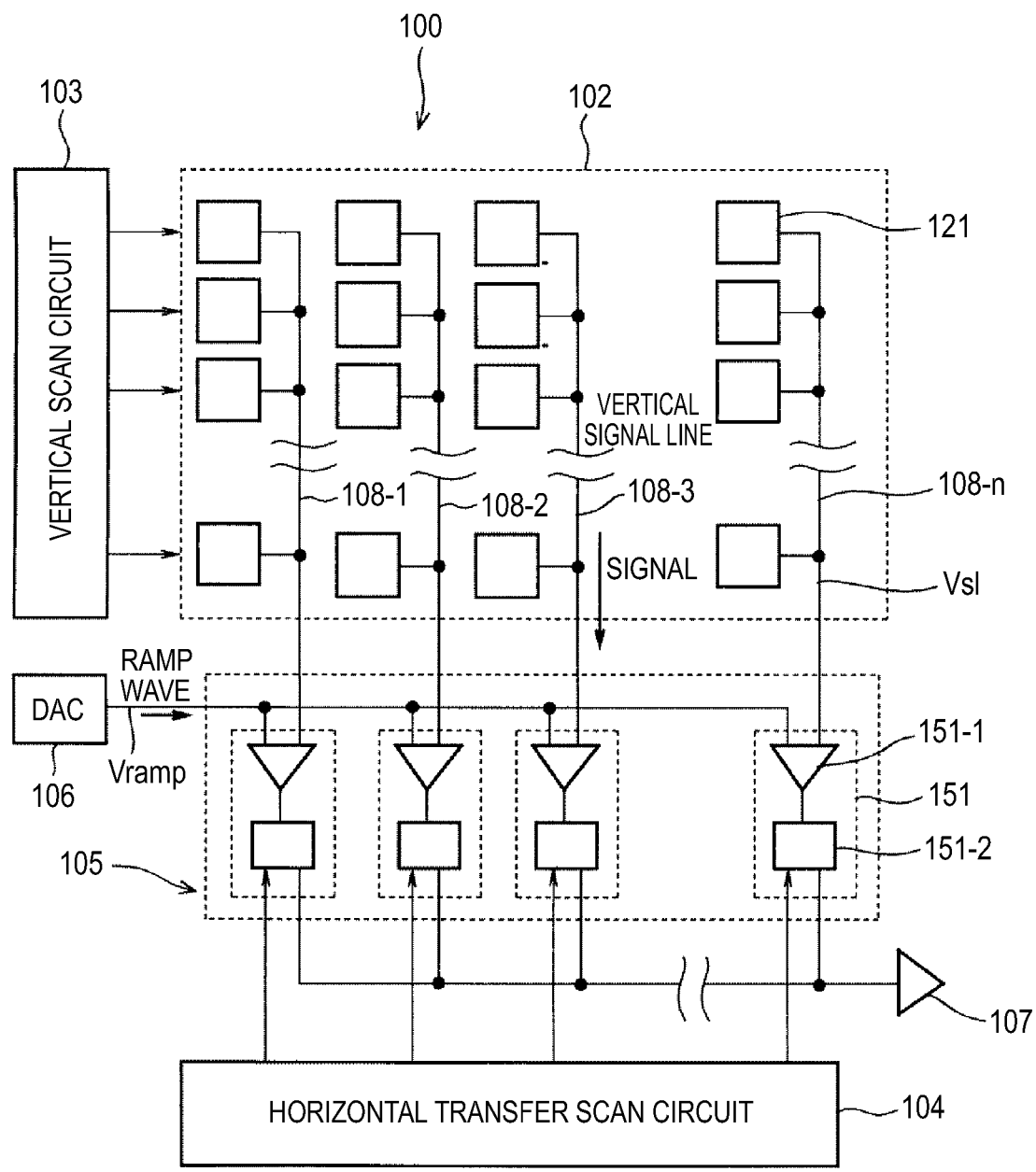
FIG. 18 is a block diagram showing a configuration example of a column parallel ADC-mounted solid-state image sensing device.

In the case where the A/D converters 20 shown in FIG. 4 operating according to the control signals are applied to an image sensor in column parallel arrangement, for example, when the application is as shown in FIG. 18, the control signals EBSEL, EBCK, EB4CK, XEBMSK, etc. are control signals commonly distributed to all columns. FIG. 18 is a block diagram showing a configuration example of a column parallel ADC-mounted solid-state image sensing device (CMOS image sensor) when the A/D converters 20 shown in FIG. 4 are applied to an image sensor in column parallel arrangement.

A solid-state image sensing device 100 shown in FIG. 18 has a pixel unit 102, a vertical scan circuit 103, a horizontal transfer scan circuit 104, and a column processing circuit group 105 including a group of ADCs. Further, the solid-state image sensing device 100 has a digital-analog converter (DAC) 106 and an amplifier circuit 107. The DAC 106 corresponds to the reference voltage supply unit 21 in FIG. 3. The pixel unit 102 includes unit pixels 121 each containing a photodiode (photoelectric conversion device) and an in-pixel amplifier arranged in a matrix.

The column processing circuit group 105 includes plural column processing circuits 151 forming the ADCs arranged with respect to each column. Each column processing circuit (ADC) 151 corresponds to the A/D converter circuit 20 in FIGS. 3 and 4. Each column processing circuit 151 has a comparator 151-1 that compares a reference signal RAMP (reference voltage $V_{ramp}$) as a ramp waveform obtained by changing a reference signal generated by the DAC 106 in a stepwise manner to an analog signal obtained from the pixel through a vertical signal line 108 with respect to each row line. The comparator 151-1 corresponds to the comparator 22 in FIG. 3.

Further, each column processing circuit 151 has a counter latch 151-2 that counts a comparison time of the comparator 151-1 and holds its count result. The counter latch 151-2 corresponds to the latch-decode circuit 23 and the ripple counter 24 in FIG. 3. The column processing circuits 151 each has an n-bit digital signal conversion function (14 bits in the example shown in FIG. 3) and is provided with respect to each of vertical signal lines (column lines) 108-1 to 108-n, and thereby, form a column parallel ADC block. The output of each memory 151-2 is connected to a horizontal transfer line 109 having a width of k bits, for example. Furthermore, k amplifier circuits 107 corresponding to the horizontal transfer lines are provided.

In the solid-state image sensing device 100, the column processing circuits 151, i.e., the A/D converter circuits 20 are arranged in parallel, and the control signals EBSEL, EBCK, EB4CK, XEBMSK, etc. are commonly distributed to the respective A/D converter circuits 20. Accordingly, when the clock signals are stopped and the resolution is reduced in the predetermined region (for example, the white region), because the data to be A/D-converted are different with respect to each column, the codes of the different resolution with respect to each column are stored in the extension codes, however, the decode processing is performed by the specific control signals in common. Therefore, it is not necessarily ensured that the times such as the times when the clock signals are stopped are appropriate in all A/D converter circuits 20 and decoding is executed.

Figure 19:
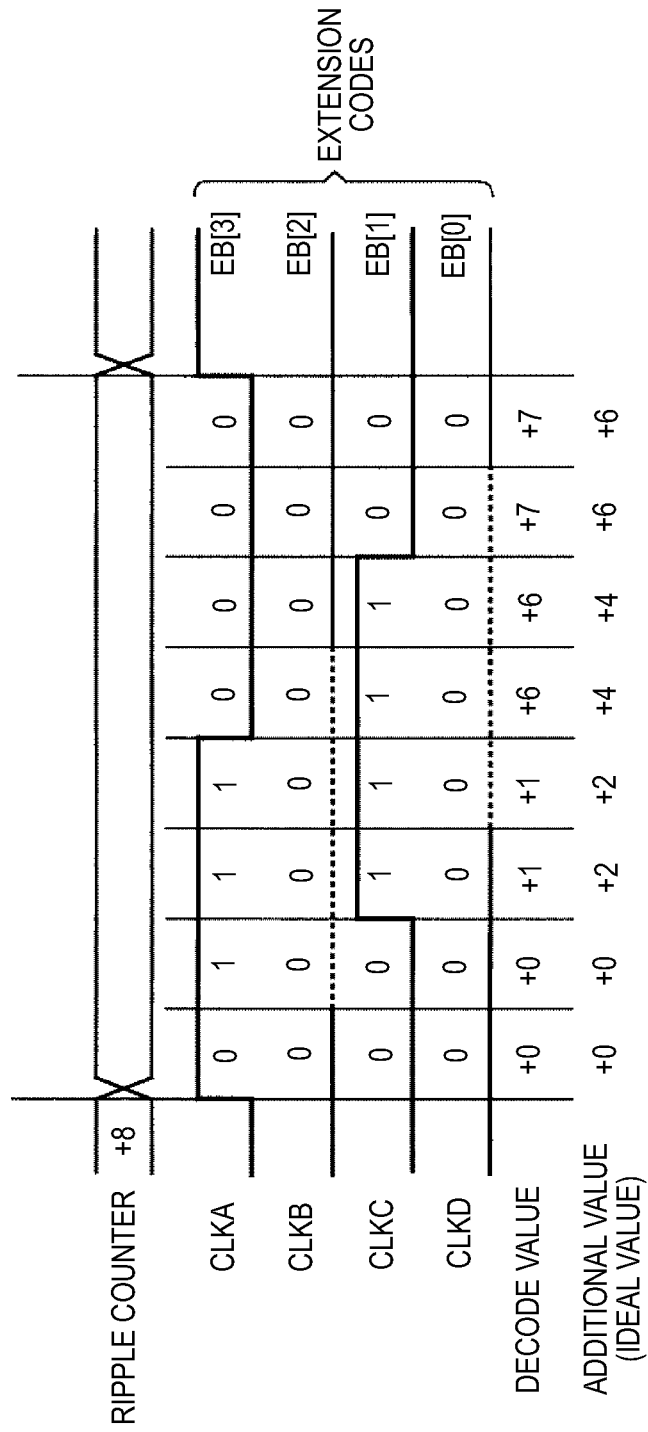
FIG. 19 is a diagram for explanation of an operation of the circuit shown in FIG. 4.

FIG. 19 shows decoding results of the extension codes of the 2-bit TDC by decode processing of the 3-bit TDC. In the case of the 2-bit TDC, because the clock signal CLKB is stopped, its output is zero. Similarly, in the case of the 2-bit TDC, because the clock signal CLKD is stopped, its output is zero. The values by the two clock signals are not used under the normal conditions in the case of the 2-bit TDC, however, if the processing is erroneously performed as the 3-bit TDC, the values by the two clock signals are also processed.

As a result, as has been explained with reference to FIG. 10, in the case of the 2-bit TDC, under the normal conditions, the decode values (additional values) are 0, 0, 2, 2, 4, 4, 6, 6, however, as shown in FIG. 19, if the extension codes of the 2-bit TDC are decoded by decode processing of the 3-bit TDC, the decode values are 0, 0, 1, 1, 6, 6, 7, 7.

Note that the ideal decode values (additional values) refer to values having ideal linearity in response to the resolution. The actual decode values refer to decode values when processing, which will be described later, is not performed. If the processing to be described is performed, the differences between the actual decode values and the ideal decode values are smaller.

Figure 20:
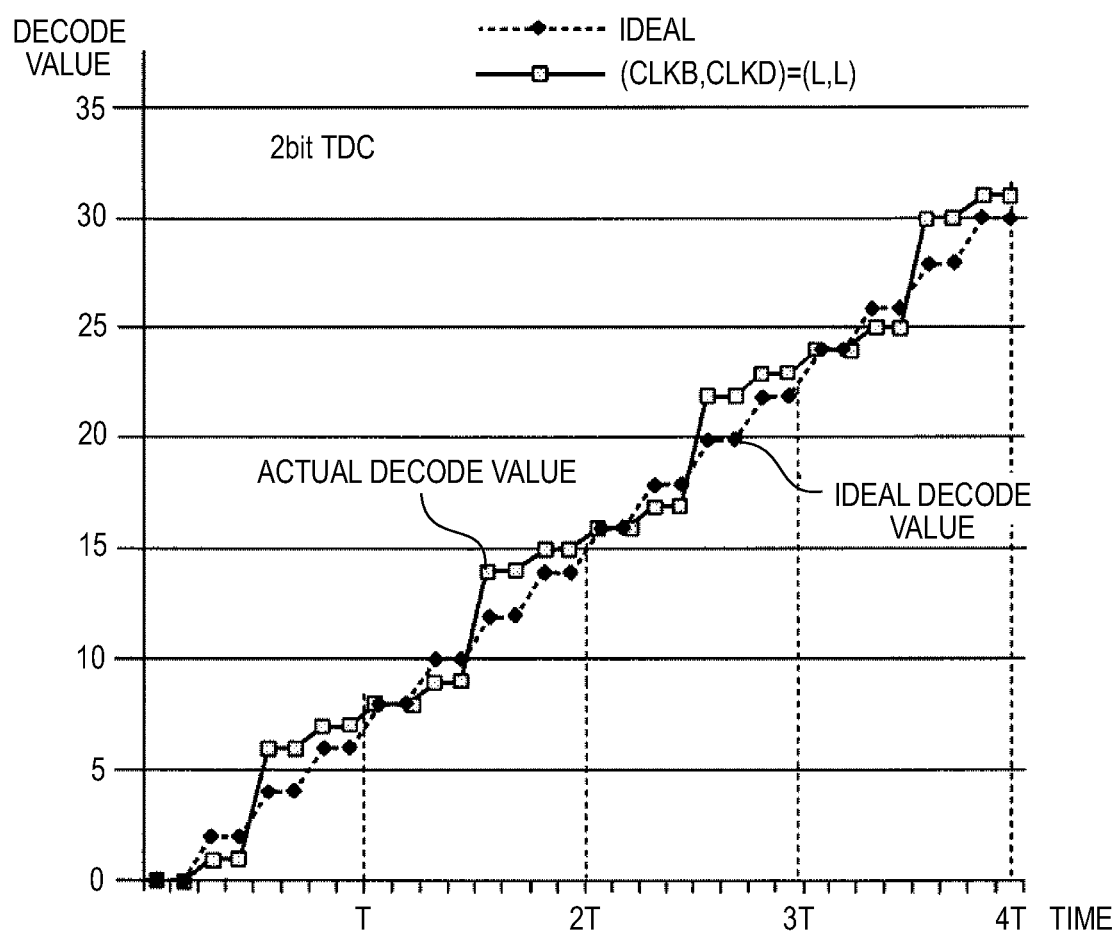
FIG. 20 is a diagram for explanation of linearity.

FIG. 20 is a graph of the results shown in FIG. 19. FIG. 20 is a graph formed by respectively plotting the ideal decode values and the actual decode values as decoding results of the extension codes of the 2-bit TDC by the decode processing of the 3-bit TDC. In FIG. 20, circle points are the plots of the ideal decode values. Further, square points are the plots of the actual decode values, and the decode values are obtained when the clock signal CLKB and the clock signal CLKD are respectively stopped at the low states.

Figure 21:
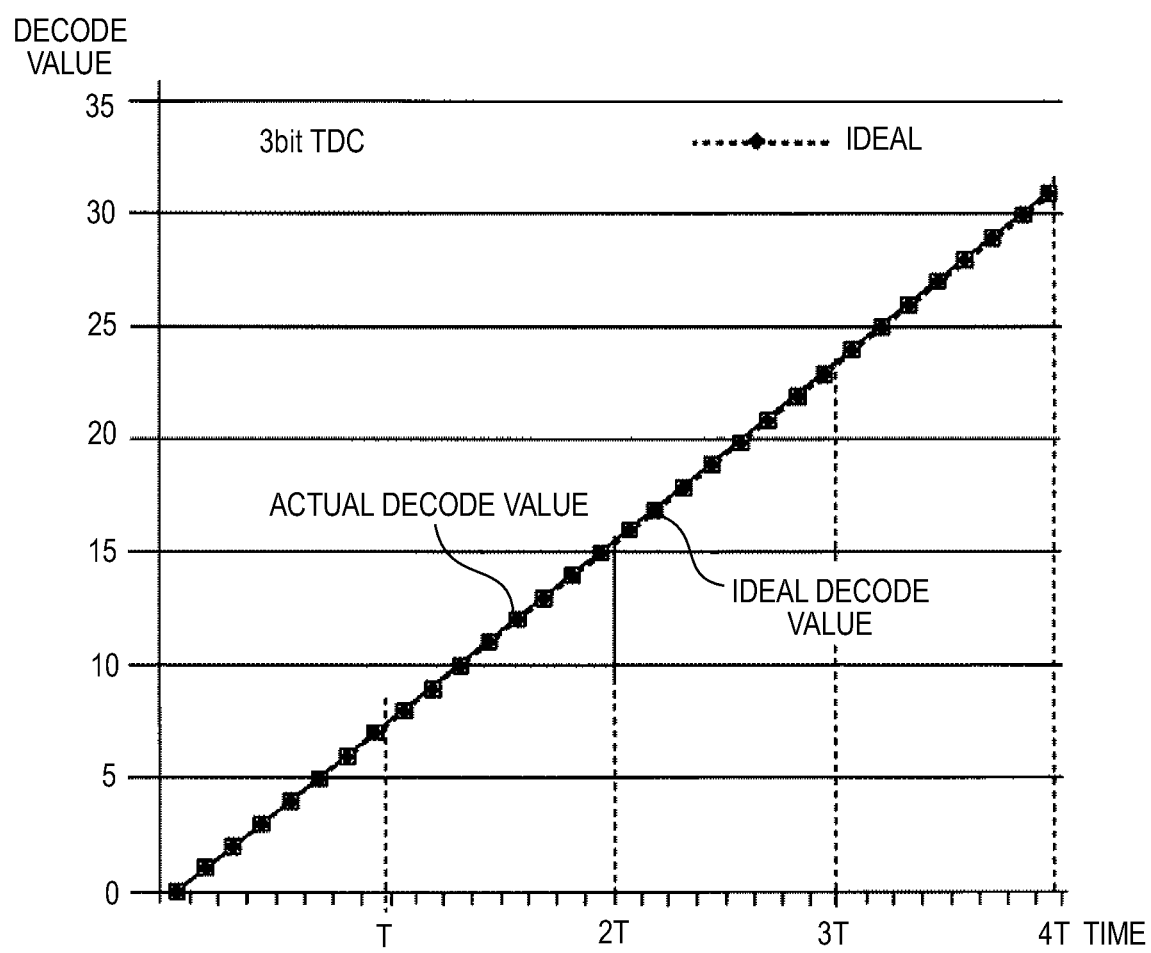
FIG. 21 is a diagram for explanation of linearity.

FIG. 20 shows linearity (fidelity of output signals with respect to input signals) of A/D conversion with the time on the horizontal axis and the decode value on the vertical axis. From FIG. 20, it can be seen that the ideal decode values deviate from the actual decode values. For reference, FIG. 21 shows a graph formed by respectively plotting ideal decode values and actual decode values as decoding results of the extension codes of the 3-bit TDC by the decode processing of the 3-bit TDC. In this case, the ideal decode values coincide with the actual decode values because the extension codes of the 3-bit TDC are decoded by the decode processing of the 3-bit TDC. Like this, it is preferable that the ideal decode values coincide with the actual decode values as much as possible.

That is, it is preferable that, when the clock signals are stopped, the actual decode values as close to the ideal decode values as possible are output. However, if the processing to be described is not performed, as shown in FIG. 20, when the two clock signals are stopped, the ideal decode values deviate from the actual decode values.

Figure 22:
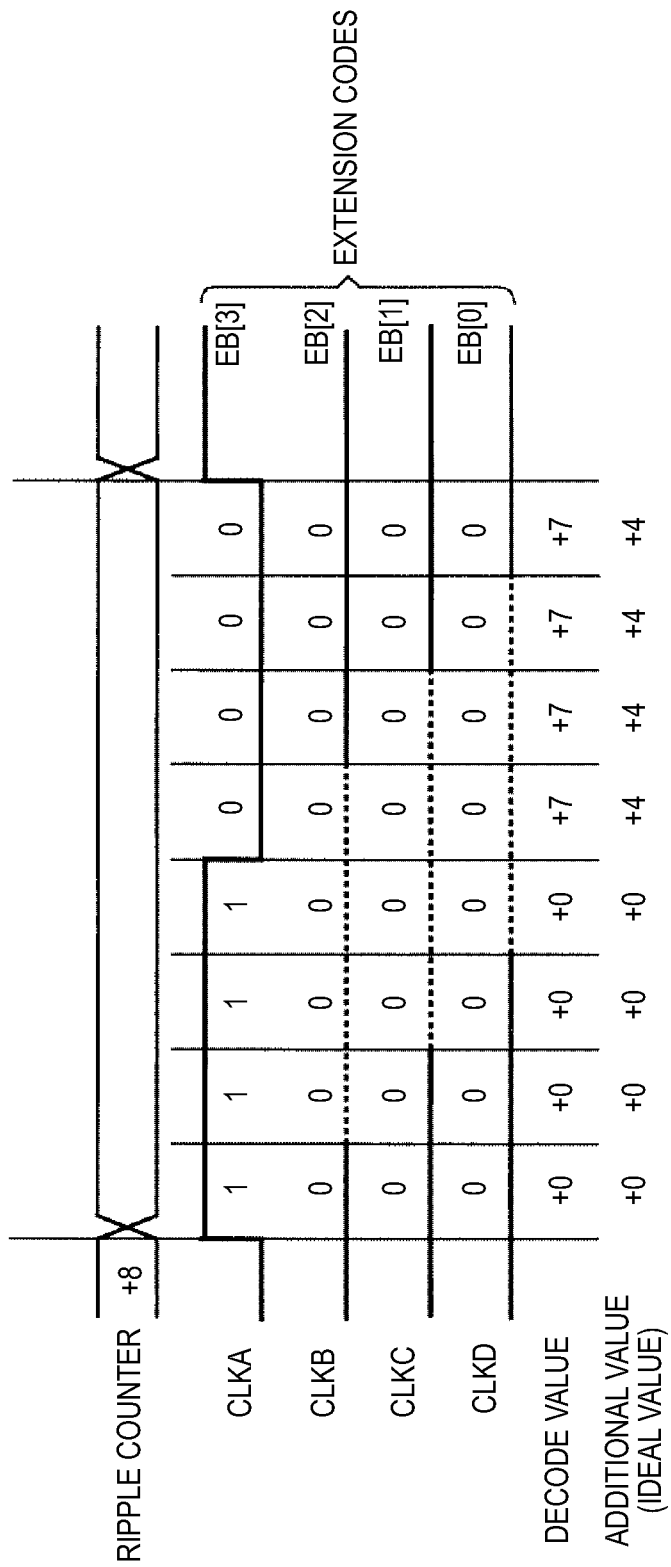
FIG. 22 is a diagram for explanation of an operation of the circuit shown in FIG. 4.

Similarly, the case where the extension codes of the 1-bit TDC are decoded by decode processing of the 3-bit TDC will be explained. FIG. 22 shows decoding results of the extension codes of the 1-bit TDC by decode processing of the 3-bit TDC. In the case of the 1-bit TDC, because the clock signal CLKB is stopped, its output is zero. Similarly, in the case of the 1-bit TDC, because the clock signals CLKC and CLKD have been already stopped, both of their outputs are zero. The values by the three clock signals are not used under the normal conditions in the case of the 1-bit TDC, however, if the processing is erroneously performed as the 3-bit TDC, the values by the three clock signals are also processed.

Figure 23:
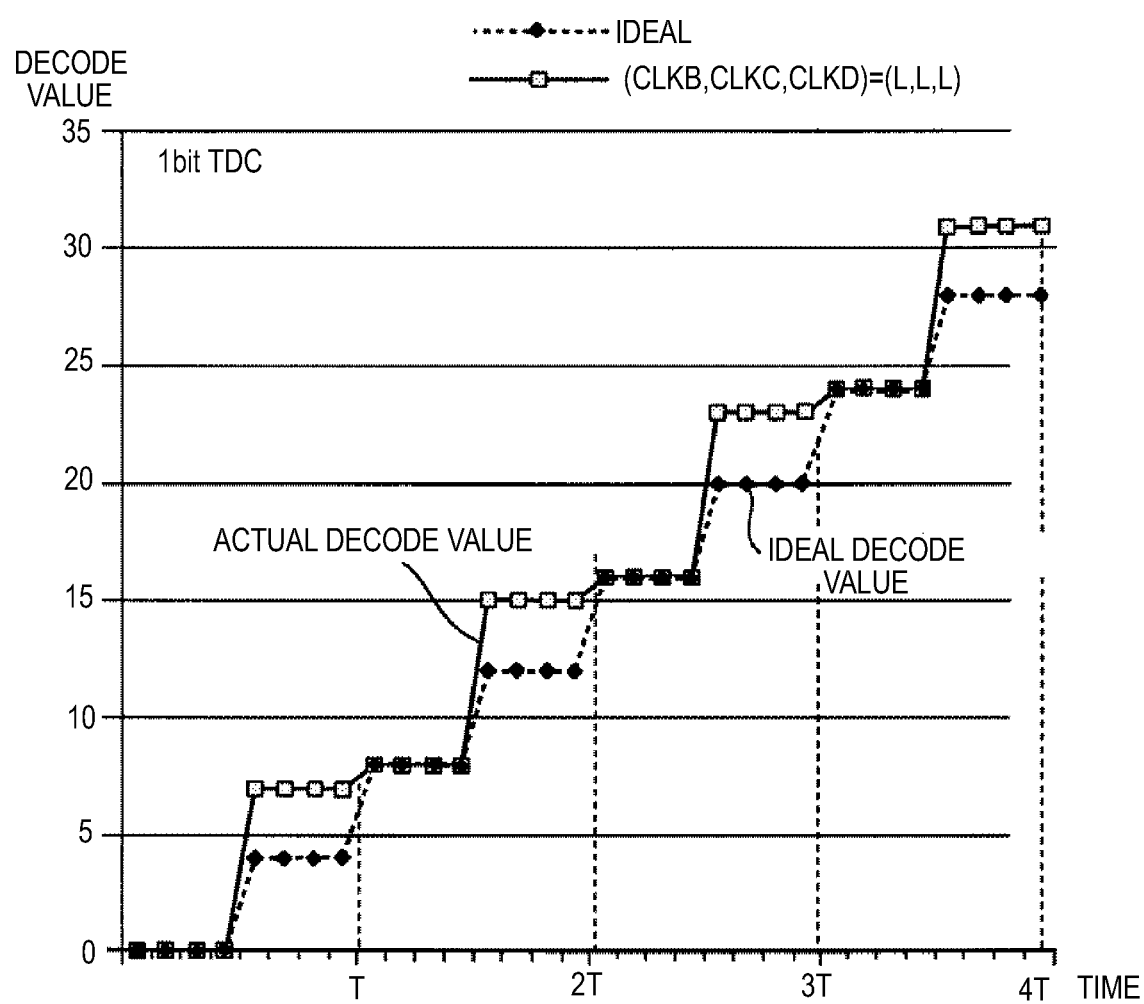
FIG. 23 is a diagram for explanation of linearity.

As a result, as has been explained with reference to FIG. 13, in the case of the 1-bit TDC, under the normal conditions, the additional values are 0, 0, 0, 0, 4, 4, 4, 4, however, as shown in FIG. 22, if the extension codes of the 1-bit TDC are decoded by decode processing of the 3-bit TDC, the decode values are 0, 0, 0, 0, 7, 7, 7, 7. FIG. 23 is a graph showing them. FIG. 23 is a graph formed by respectively plotting the ideal decode values and the actual decode values as decoding results of the extension codes of the 1-bit TDC by the decode processing of the 3-bit TDC.

In FIG. 23, circle points are the plots of the ideal decode values. Further, square points are the plots of the actual decode values, and the decode values are obtained when the clock signal CLKB, the clock signal CLKC, and the clock signal CLKD are respectively stopped at the low states.

FIG. 23 shows linearity of A/D conversion with the time on the horizontal axis and the decode value on the vertical axis. From FIG. 23, it is seen that the ideal decode values deviate from the actual decode values. Also, in this case, it is preferable that, when the clock signals are stopped, the actual decode values as close to the ideal decode values as possible are output. However, if the processing to be described is not performed, as shown in FIG. 23, when the three clock signals are stopped, the ideal decode values deviate from the actual decode values.

As described above, it is considered that, when the clock signals are stopped, the ideal decode values deviate from the actual decode values, and the linearity is deteriorated. In order to prevent deterioration of the linearity, the processing to be described is performed. Before the explanation of the processing, an explanation of the possibility that monotonic increasing characteristics may be lost by stopping the clock signals will be made.

Figure 24:
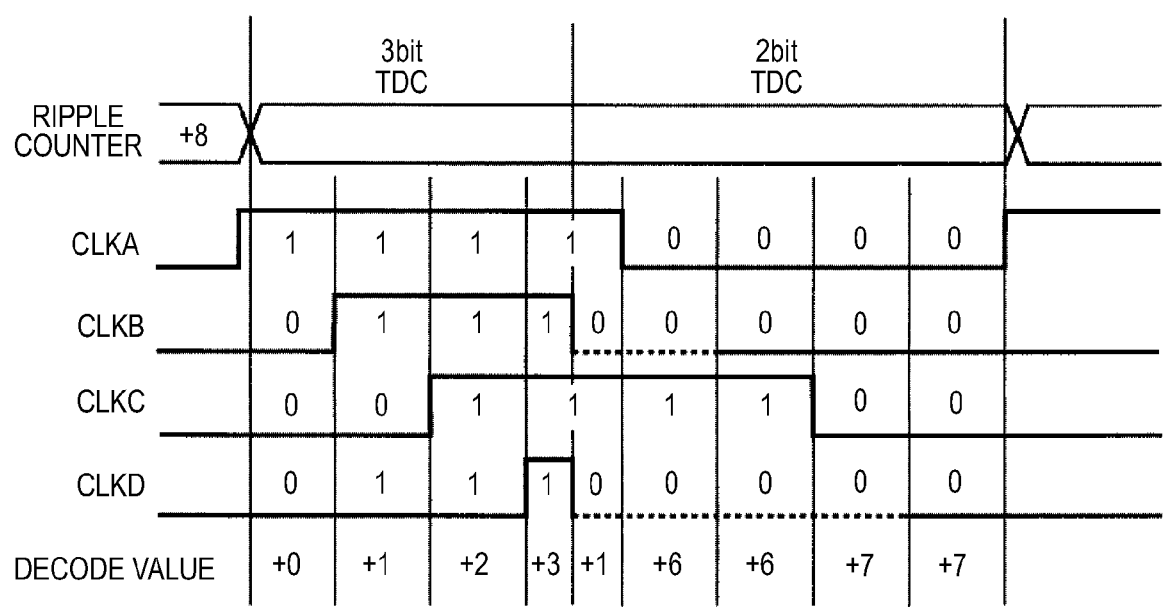
FIG. 24 is a diagram for explanation of loss of monotonic increasing characteristics.

FIG. 24 shows decode values when the clock signals are stopped, i.e., at the joint of the TDCs with different resolution. In the example shown in FIG. 22, it is known that the additional value rises and falls in the part of the joint and the monotonic increasing characteristics are lost. That is, the decode value before switching of the operation mode from the 3-bit TDC to the 2-bit TDC is "3", and the decode value after that is "1" and the later decode value is "6".

Under the normal conditions, if the processing remains the 3-bit TDC, the decode values monotonically increase as 0, 1, 2, 3, 4, 5, 7, 8 as shown in FIG. 5. Further, if the processing is the 2-bit TDC, the decode values monotonically increase as 0, 0, 2, 2, 4, 4, 6, 6 as shown in FIG. 10. However, according to the time when the operation mode is switched from the 3-bit TDC to the 2-bit TDC, the decode values may not monotonically increase as 0, 1, 2, 3, 1, 6, 6, 7, 7, for example, as shown in FIG. 24. Though not illustrated, also, when the operation mode is switched from the 2-bit TDC to the 1-bit TDC, the decode values may not monotonically increase.

As described above, when the clock signals are stopped, the monotonically increasing characteristics may be lost, and, when the monotonic increasing characteristics are lost, the precision of the decode values at the loss may be lower. Accordingly, the loss of the monotonic increasing characteristics may be prevented by performance of the processing to be explained as below.

Regarding Embodiment 1-1

The processing in consideration of the above described deterioration of linearity and loss of monotonic increasing characteristics will be explained. First, the processing of relaxing the deterioration of linearity and the loss of monotonic increasing characteristics by adjusting the logical values when the clock signals are stopped will be explained.

Reference to FIGS. 19, 22 is made again. FIG. 19 shows the decoding results of the extension codes of the 2-bit TDC by decode processing of the 3-bit TDC. In FIG. 19, both the clock signal CLKB and the clock signal CLKD are stopped and fixed at the low (hereinafter, they will be described as Lo-fixed). Accordingly, the logical value is "0". Similarly, in FIG. 22, all of the clock signal CLKB, the clock signal CLKC, and the clock signal CLKD are stopped and Lo-fixed. Accordingly, the logical value is "0".

Reference to FIG. 16 is made again. FIG. 16 shows the A/D conversion period and the operation periods of the four clock signals. In FIG. 16, it is known that the clock signal CLKB and the clock signal CLKD are stopped when the operation mode is switched from the 3-bit TDC mode to the 2-bit TDC mode and respectively Lo-stopped. Further, when the operation mode is switched from the 2-bit TDC mode to the 1-bit TDC mode, the clock signal CLCK is also stopped and the clock signal CLCK is also Lo-stopped.

When the mode is switched, the clock signals to be stopped are not stopped at Low as described above, but stopped at High (hereinafter, referred to as "Hi-stopped"). In other words, when the mode is switched, the clock signals are stopped so that the logical values of the clock signals to be stopped may not be "0", but may be "1".

Figure 25:
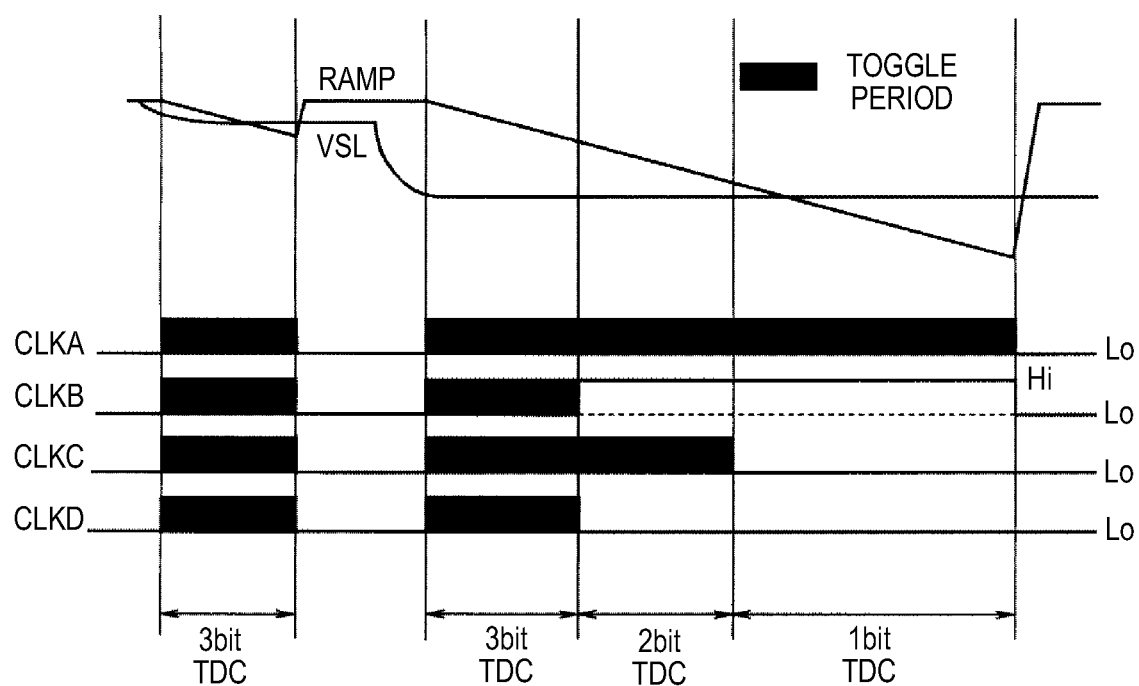
FIG. 25 is a diagram for explanation of switching among operation modes.

Specifically, as shown in FIG. 25, in the case where the clock signals are stopped in the white region, for example, the clock signal CLKB as one of the clock signals is stopped, the signal is not Lo-fixed, but Hi-fixed. In FIG. 25, the solid line indicates the actual operation. When the mode is switched from the 3-bit TDC mode to the 2-bit TDC mode, the clock signal CLKB is Hi-stopped and stopped with the High state kept. When the mode is switched from the 2-bit TDC mode to the 1-bit TDC mode, the clock signal CLKC is Lo-stopped and stopped with the Low state kept. When the operation mode is switched from the 3-bit TDC mode to the 2-bit TDC mode, the clock signal CLKD is Lo-stopped and stopped with the Low state kept.

In this case, the example in which only one clock signal (clock signal CLKB) is Hi-stopped when the mode is switched has been shown. Here, the explanation is made by taking the example in which the clock signal is Hi-stopped, however, the description is not for limiting the case where only one clock signal is Hi-stopped.

For example, when the mode is switched from the 3-bit TDC to the 2-bit TDC, the clock signal CLKD is also stopped, and the clock signal CLKD may be Hi-stopped like the clock signal CLKB. Further, the clock signal CLKB may be Lo-stopped and the clock signal CLKD may be Hi-stopped. Furthermore, when the mode is switched from the 2-bit TDC to the 1-bit TDC, the clock signal CLKC may also be Hi-stopped.

Note that which clock signal is Hi-stopped and which clock signal is Lo-stopped can be determined by simulations in the design phase or the like. The simulation results are shown and explained in FIG. 28, which will be described later.

Here, the explanation will be continued under the condition that, when the mode is switched from the 3-bit TDC to the 2-bit TDC, the clock signal CLKB is Hi-stopped and the other clock signals are Lo-stopped. In the case where the clock signals are stopped in this manner, for the EB[2] in the period when the clock signals are stopped, not the logical value "0", but the logical value "1" is stored. This applies to the algorithm of the decode processing, and thereby, the deterioration of linearity can be prevented and the loss of monotonic increasing characteristics can be relaxed.

Figure 26:
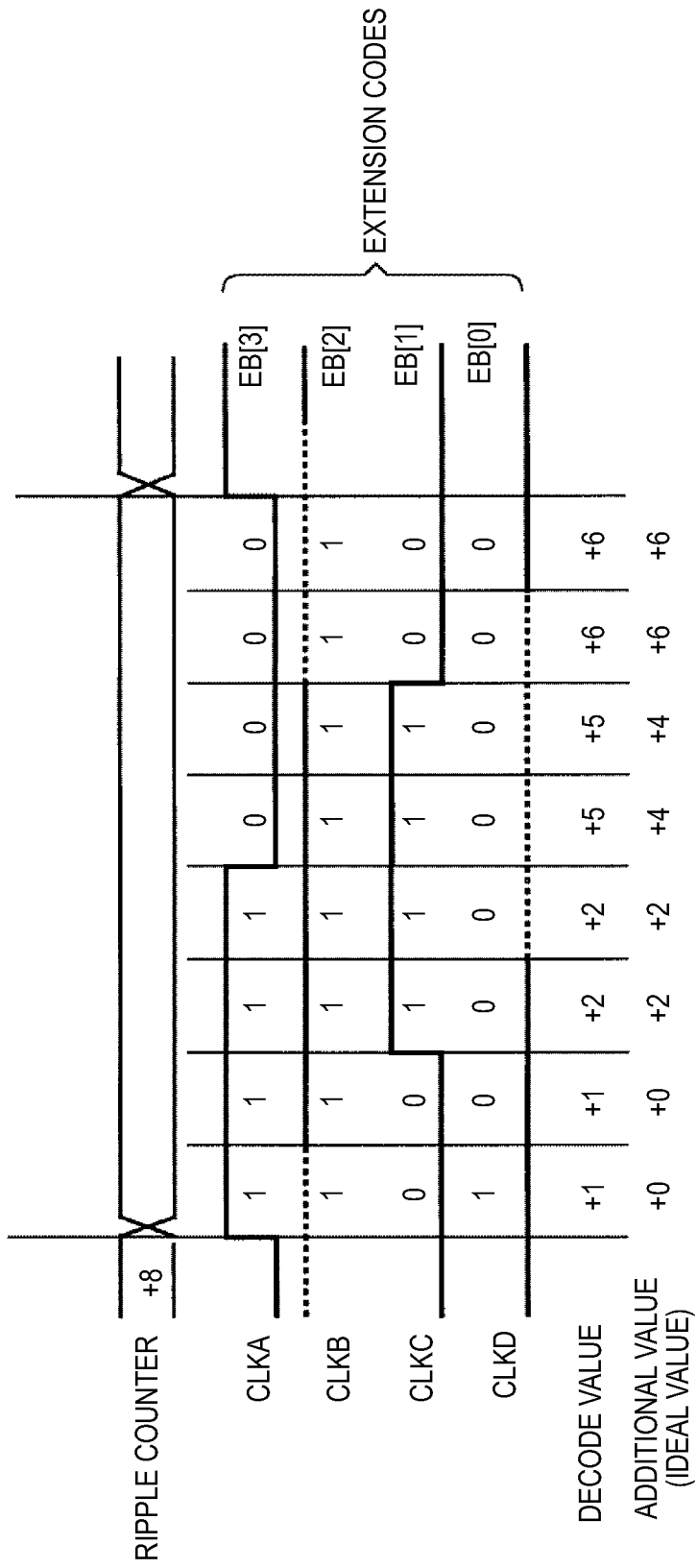
FIG. 26 is a diagram for explanation of an operation of the circuit shown in FIG. 4.

This will be explained with reference to FIG. 26. FIG. 26 shows decoding results of the extension codes latched in the 2-bit TDC mode by the decode processing of the 3-bit TDC. FIG. 26 corresponds to FIG. 19. FIG. 19 shows the decoding results of the extension codes of the 2-bit TDC when the clock signal CLKB is Lo-stopped by the decode processing of the 3-bit TDC, and FIG. 26 is different in that it shows decoding results of the extension codes of the 2-bit TDC when the clock signal CLKB is Hi-stopped by the decode processing of the 3-bit TDC.

Referring to FIG. 19 again, in the case of the 2-bit TDC, under the normal conditions, the additional values (decode values) are 0, 0, 2, 2, 4, 4, 6, 6, however, when the extension codes of the 2-bit TDC are decoded by the decode processing of the 3-bit TDC and the clock signal CLKB is Lo-stopped, the decode values are 0, 0, 1, 1, 6, 6, 7, 7. In this case, the differences between the ideal values and the actual decode values are 0, 0, −1, −1, 2, 2, 1, 1.

However, as shown in FIG. 26, even when the extension codes of the 2-bit TDC are decoded by the decode processing of the 3-bit TDC, if the clock signal CLKB is Hi-stopped, the decode values are 1, 1, 2, 2, 5, 5, 6, 6. In this case, the differences between the ideal values and the actual decode values are 1, 1, 0, 0, 1, 1, 0, 0.

As shown in FIG. 19, when the clock signal CLKB is Lo-stopped, the differences between the ideal values and the actual decode values are "2" at the maximum. On the other hand, as shown in FIG. 26, when the clock signal CLKB is Hi-stopped, the differences between the ideal values and the actual decode values are "1" at the maximum. That is, it is known that, when the clock signal CLKB is Hi-stopped, the deviations from the ideal values are smaller.

Figure 27:
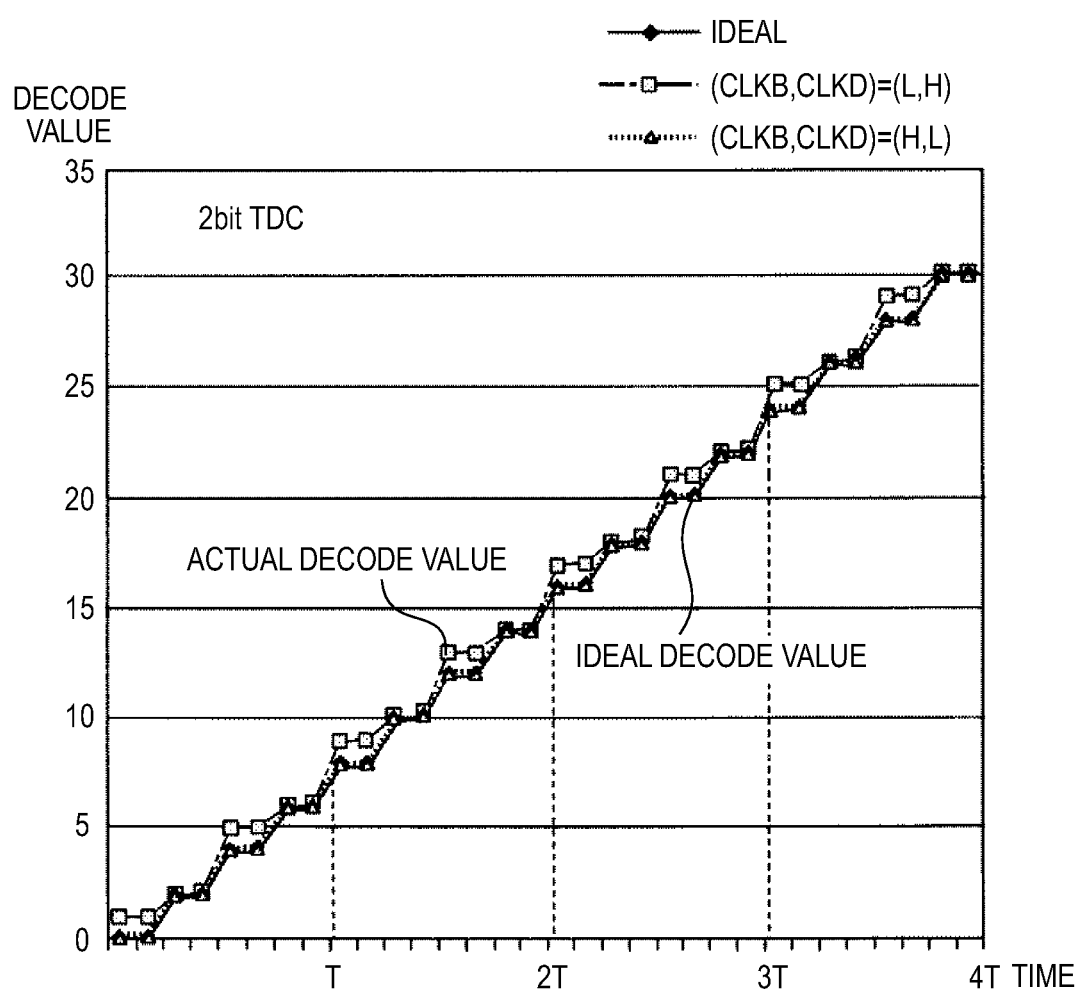
FIG. 27 is a diagram for explanation of linearity.

Further, reference to FIG. 27 is made concerning the deviation. FIG. 27 shows linearity of A/D conversion with the time on the horizontal axis and the decode value on the vertical axis. FIG. 27 corresponds to FIG. 20. FIG. 20 shows the linearity of A/D conversion when the clock signal is Lo-stopped, and FIG. 27 shows the linearity of A/D conversion when the clock signal is Hi-stopped. In comparison between FIG. 20 and FIG. 27, it can be clearly seen that, in the case shown in FIG. 27, the deviation from the ideal decode values from the actual decode values is smaller and the actual decode values are plotted as the values closer to the ideal decode values than in the case shown in FIG. 20.

In this manner, by stopping the clock signals in the High state, the linearity is improved.

As described above, the clock signal to be Hi-stopped is not limited to the clock signal CLKB, but also the other clock signal (clock signal CLKC) may be Hi-stopped. FIG. 28 shows the maximum errors by combinations when the clock signal CLKB or/and clock signal CLKC are Lo-stopped or/and Hi-stopped.

When both the clock signal CLKB and the clock signal CLKD are Lo-stopped, the maximum error is 2 LSB. When both the clock signal CLKB and the clock signal CLKD are Hi-stopped, the maximum error is 2 LSB. When the clock signal CLKB is Lo-stopped and the clock signal CLKD is Hi-stopped, the maximum error is 1 LSB. When the clock signal CLKB is Hi-stopped and the clock signal CLKD is Lo-stopped, the maximum error is 1 LSB.

As a result, it is known that, by Hi-stopping either of the clock signal CLKB or the clock signal CLKD, the maximum error may be suppressed to 1 LSB. Therefore, when the mode is switched from the 3-bit TDC to the 2-bit TDC, by Hi-stopping either of the clock signal CLKB or the clock signal CLKD, the linearity is improved.

Figure 29:
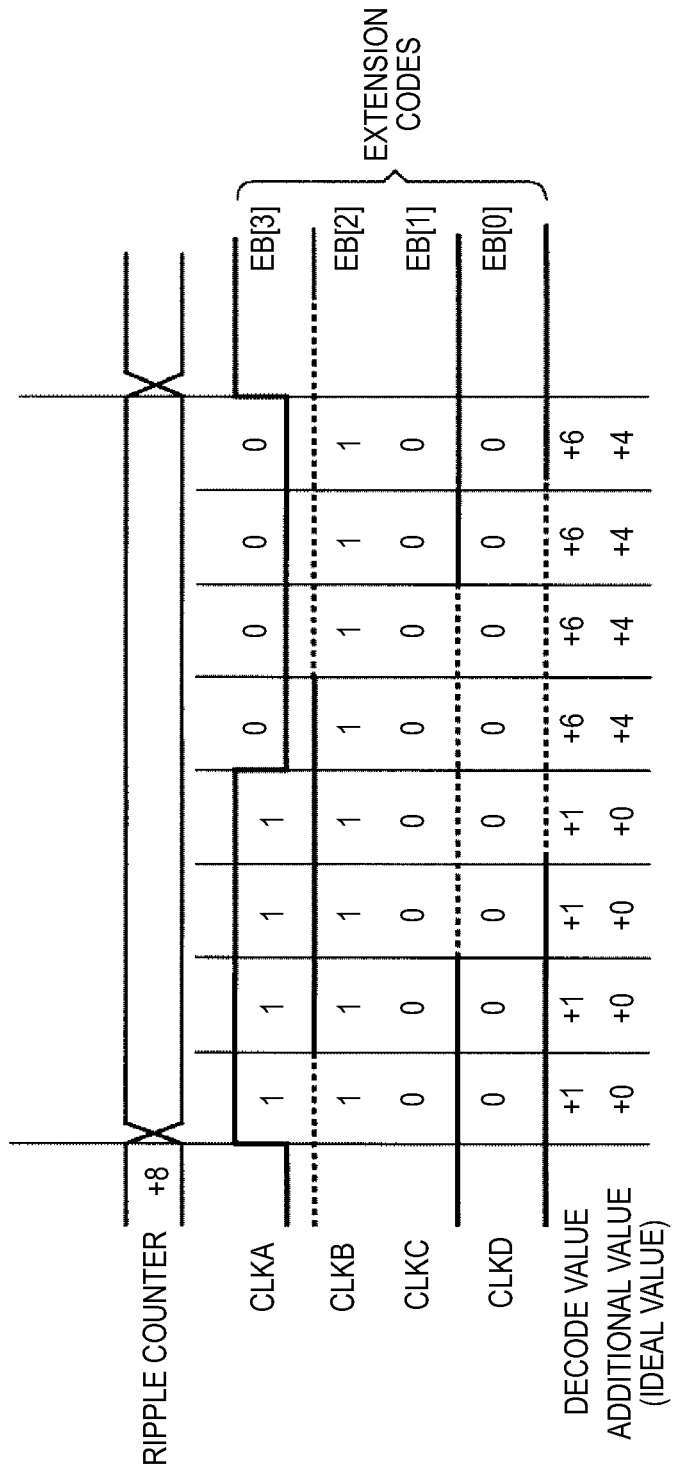
FIG. 29 is a diagram for explanation of an operation of the circuit shown in FIG. 4.

Next, the case of the 1-bit TDC will be explained. FIG. 29 shows decoding results of the extension codes latched in the 1-bit TDC mode by the decode processing of the 3-bit TDC. FIG. 29 corresponds to FIG. 22. FIG. 22 shows the decoding results of the extension codes of the 1-bit TDC when the clock signal CLKC is Lo-stopped by the decode processing of the 3-bit TDC, and FIG. 29 is different in that it shows decoding results of the extension codes of the 1-bit TDC when the clock signal CLKC is Hi-stopped by the decode processing of the 3-bit TDC.

Referring to FIG. 22 again, in the case of the 1-bit TDC, under the normal conditions, the additional values (decode values) are 0, 0, 0, 0, 4, 4, 4, 4, however, when the extension codes of the 1-bit TDC are decoded by the decode processing of the 3-bit TDC and the clock signal CLKC is Lo-stopped, the decode values are 0, 0, 0, 0, 7, 7, 7, 7. In this case, the differences between the ideal values and the actual decode values are 0, 0, 0, 0, 3, 3, 3, 3.

However, as shown in FIG. 29, even when the extension codes of the 1-bit TDC are decoded by the decode processing of the 3-bit TDC, if the clock signal CLKC is Hi-stopped, the decode values are 1, 1, 1, 1, 6, 6, 6, 6. In this case, the differences between the ideal values and the actual decode values are 1, 1, 1, 1, 2, 2, 2, 2.

As shown in FIG. 22, when the clock signal CLKC is Lo-stopped, the differences between the ideal values and the actual decode values are "3" at the maximum. On the other hand, as shown in FIG. 29, when the clock signal CLKC is Hi-stopped, the differences between the ideal values and the actual decode values are "2" at the maximum. That is, it is known that, when the clock signal CLKC is Hi-stopped, the deviations from the ideal values are smaller.

Figure 30:
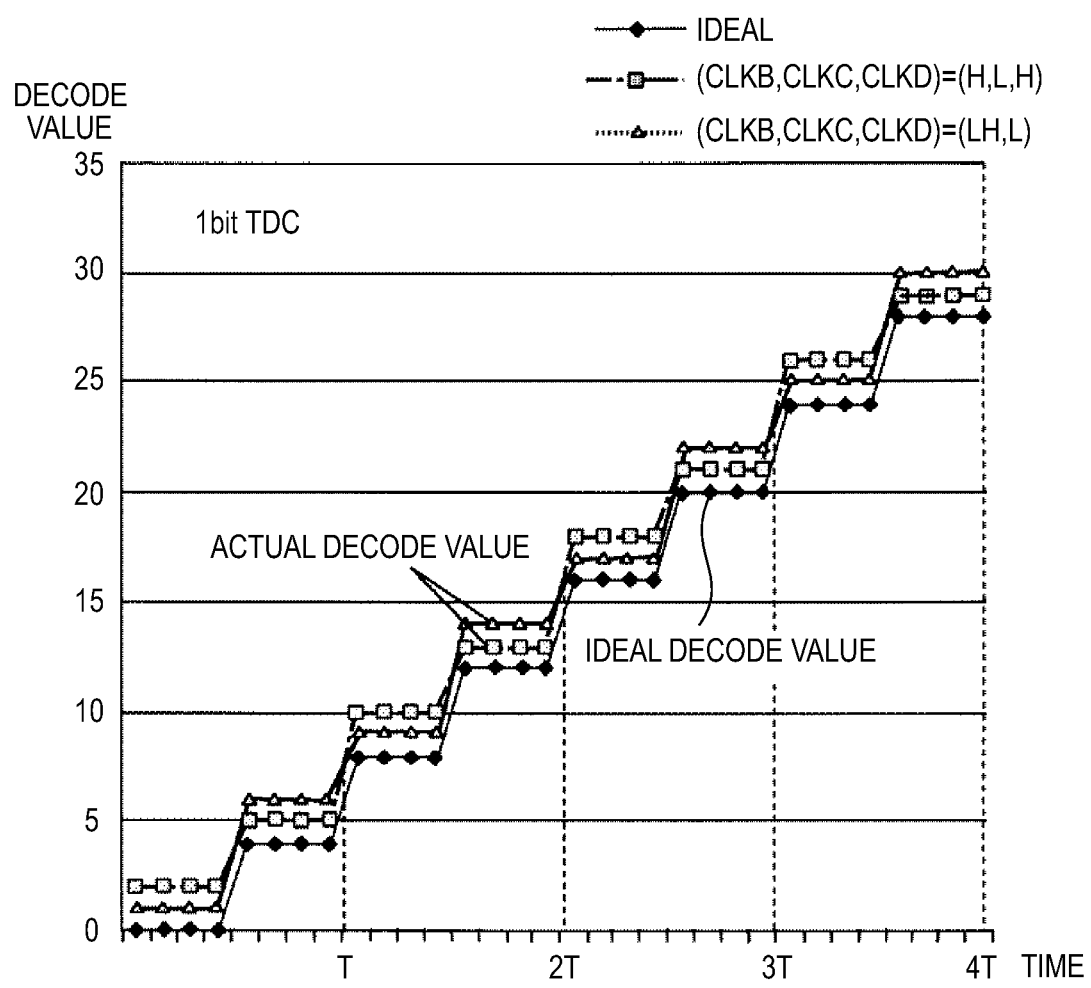
FIG. 30 is a diagram for explanation of linearity.

Further, reference to FIG. 30 is made concerning the deviation. FIG. 30 shows linearity of A/D conversion with the time on the horizontal axis and the decode value on the vertical axis. FIG. 30 corresponds to FIG. 23. FIG. 23 shows the linearity of A/D conversion when the clock signal is Lo-stopped, and FIG. 30 shows the linearity of A/D conversion when the clock signal is Hi-stopped. In comparison between FIG. 22 and FIG. 30, it can be clearly seen that, in the case shown in FIG. 30, the deviation from the ideal decode values from the actual decode values is smaller and the actual decode values are plotted as the values closer to the ideal decode values than in the case shown in FIG. 23.

In this manner, by stopping the clock signals in the High state, the linearity is improved.

The clock signal CLKC is stopped after the clock signal CLKB and the clock signal CLKD have been already stopped. Depending on whether the three clock signals are Hi-stopped or Lo-stopped, the maximum error varies. Accordingly, FIG. 31 shows combinations of the logics of stopping three clock signals CLKB, CLKC, CLKD to be stopped in the 1-bit TDC and the maximum errors thereof.

When all of the clock signal CLKB, the clock signal CLKC, and the clock signal CLKD are Lo-stopped, the maximum error is 3 LSB. When both the clock signal CLKB and the clock signal CLKD are Lo-stopped and the clock signal CLKC is Hi-stopped, the maximum error is 1 LSB. When both the clock signal CLKB and the clock signal CLKD are Hi-stopped and the clock signal CLKC is Lo-stopped, the maximum error is 1 LSB.

When the clock signal CLKB, the clock signal CLKC, and the clock signal CLKD are Hi-stopped, the maximum error is 3 LSB. When both the clock signal CLKB and the clock signal CLKC are Lo-stopped and the clock signal CLKD is Hi-stopped, the maximum error is 1 LSB. When the clock signal CLKB is Lo-stopped and both the clock signal CLKC and the clock signal CLKD are Hi-stopped, the maximum error is 1 LSB.

When the clock signal CLKB is Hi-stopped and both the clock signal CLKC and the clock signal CLKD are Lo-stopped, the maximum error is 1 LSB. When both the clock signal CLKB and the clock signal CLKC are Hi-stopped and the clock signal CLKD is Lo-stopped, the maximum error is 1 LSB.

From those, it is known that, when the clock signal CLKB, the clock signal CLKC, or the clock signal CLKD is stopped, by Hi-stopping one or two clock signals are Hi-stopped, the linearity is improved.

Further, when the operation mode transits from the 3-bit TDC to the 2-bit TDC, as has been explained with reference to FIG. 28, by Hi-stopping either the clock signal CLKB or the clock signal CLKD, the linearity is improved. This is additionally considered, and then, it is known that, when the clock signal CLKB, the clock signal CLKC, or the clock signal CLKD is stopped, either the clock signal CLKB or the clock signal CLKD may be Hi-stepped and the clock signal CLKC may be Hi-stopped or Lo-stopped.

As described above, when the clock signals are stopped in the predetermined region (for example, the white region), by stopping the signals in the High state, the reduction of the power consumption due to by stopping of the clock signals can be realized while the reduction of linearity is suppressed to the minimum.

Figure 32:
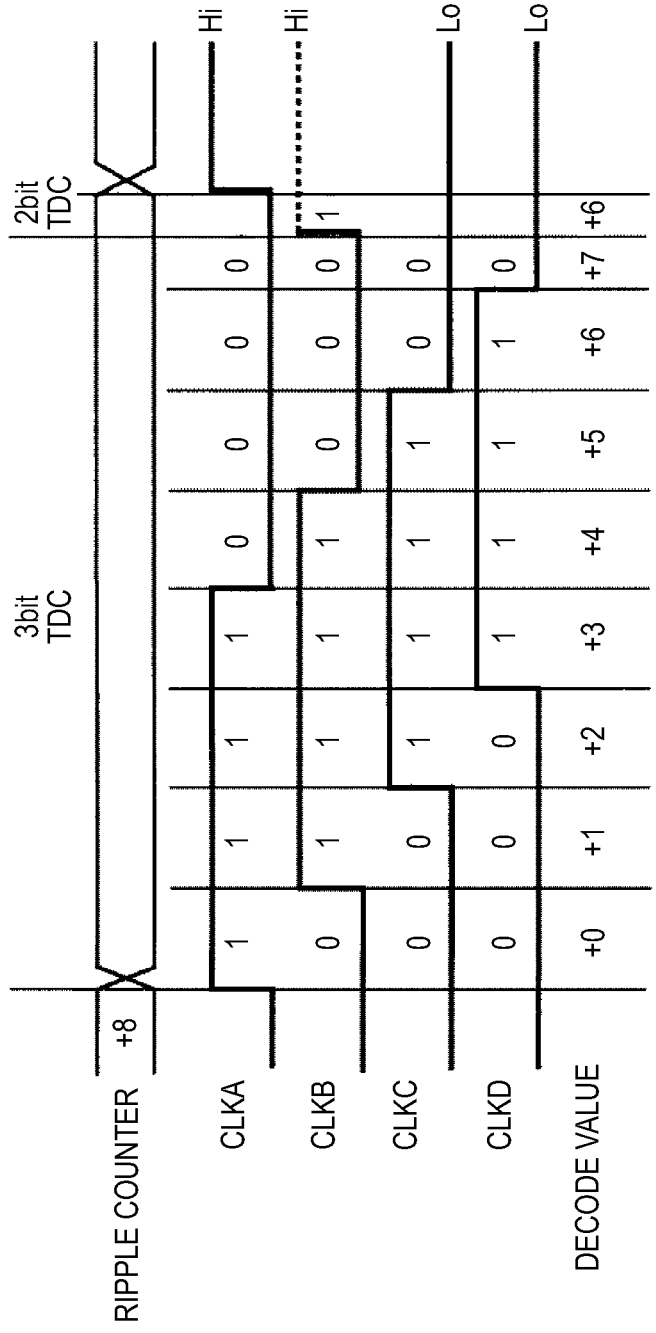
FIG. 32 is a diagram for explanation of an improvement of monotonic increasing characteristics.

Further, in this manner, by Hi-stopping the signals, the loss of monotonic increasing characteristics can be suppressed to the minimum. This will be explained with reference to FIG. 32. FIG. 32 shows decode values when the clock signals are stopped, i.e., at the joint of the TDCs with different resolution. FIG. 32 corresponds to FIG. 24. FIG. 24 shows the decode values when the clock signal is Lo-stopped at the joint of the TDCs with different resolution, and FIG. 32 is different in that it shows decode values when the clock signal is Hi-stopped at the joint of the TDCs with different resolution.

The example shown in FIG. 32 is an example in which the clock signal CLKB is High-stopped when the mode is switched from the 3-bit TDC to the 2-bit TDC. The decode values in this case are 0, 1, 2, 3, 4, 5, 6, 7, 6. When the mode is switched from the 3-bit TDC to the 2-bit TDC, the value before switching is "7" and the value after switching is "6". Like this, the values are "6", "7", and then, if it monotonically increases, becomes "8", however, becomes "6" and the monotonic increasing characteristics are lost and there is a small value of change as small as "1".

That is, in the example shown in FIG. 24, after "1", "2", "3", when the operation mode is switched, the value is "1", and there is a change of "2" from "3" to "1". Further, the decode value becomes "6" after "1", and there is a change of "5". In comparison, it is known that the change of only "1" is clearly smaller, and, even when the monotonic increasing characteristics are lost, the loss is suppressed to the minimum.

That is, by Hi-stopping the clock signals, the loss of the monotonic increasing characteristics can be suppressed to the minimum. In other words, even when clock signals are Hi-stopped and the decode value rises and falls at the joint of the TDCs with different resolution and the monotonic increasing characteristics are lost, the difference is smaller and the adverse effect can be suppressed to the minimum.

As described above, by stopping clock signals in the predetermined region (for example, the white region), the power consumption can be reduced at least by the amount of stopped clock signals. Stopping the clock signals makes the resolution lower, however, because the resolution is lower in the region less affected by the lower resolution (for example, the white region), the final decode values are not affected and the image quality may be maintained.

Thus, according to the embodiment, by reducing the resolution (switching the resolution) in the predetermined region, the power consumption can be reduced without deterioration of the image quality. Further, when the resolution is reduced, i.e., the clock signals are stopped, by appropriately setting the states of the stopped clock signals (the Low or High states), the reduction of linearity and the loss of monotonic increasing characteristics can be suppressed to the minimum.

Regarding Embodiment 1-2

In the above described embodiment 1-1, the example in which, when the clock signals are stopped, the clock signals are stopped in the High state has been explained. According to the embodiment 1-1, it may be possible to suppress the reduction of linearity and the loss of monotonic increasing characteristics to the minimum, however, it is difficult to completely suppress them. Next, an embodiment of completely suppressing the reduction of linearity and the loss of monotonic increasing characteristics will be explained.

In the embodiment, the change of the upper bits of the counters are observed, the illuminance and the resolution of the columns are recognized, and, from the plural decode controls distributed to the entire columns, decode control is selectively performed in response to the resolution of the respective columns. In the embodiment, similarly, the clock signals are stopped in a predetermined region and the following processing is executed when they are stopped. Further, the processing explained as below is processing applied to the column parallel ADC-mounted solid-state image sensing device (CMOS image sensor) shown in FIG. 18, using plural A/D converters, and performed when the control signals are used in common.

Figure 33:
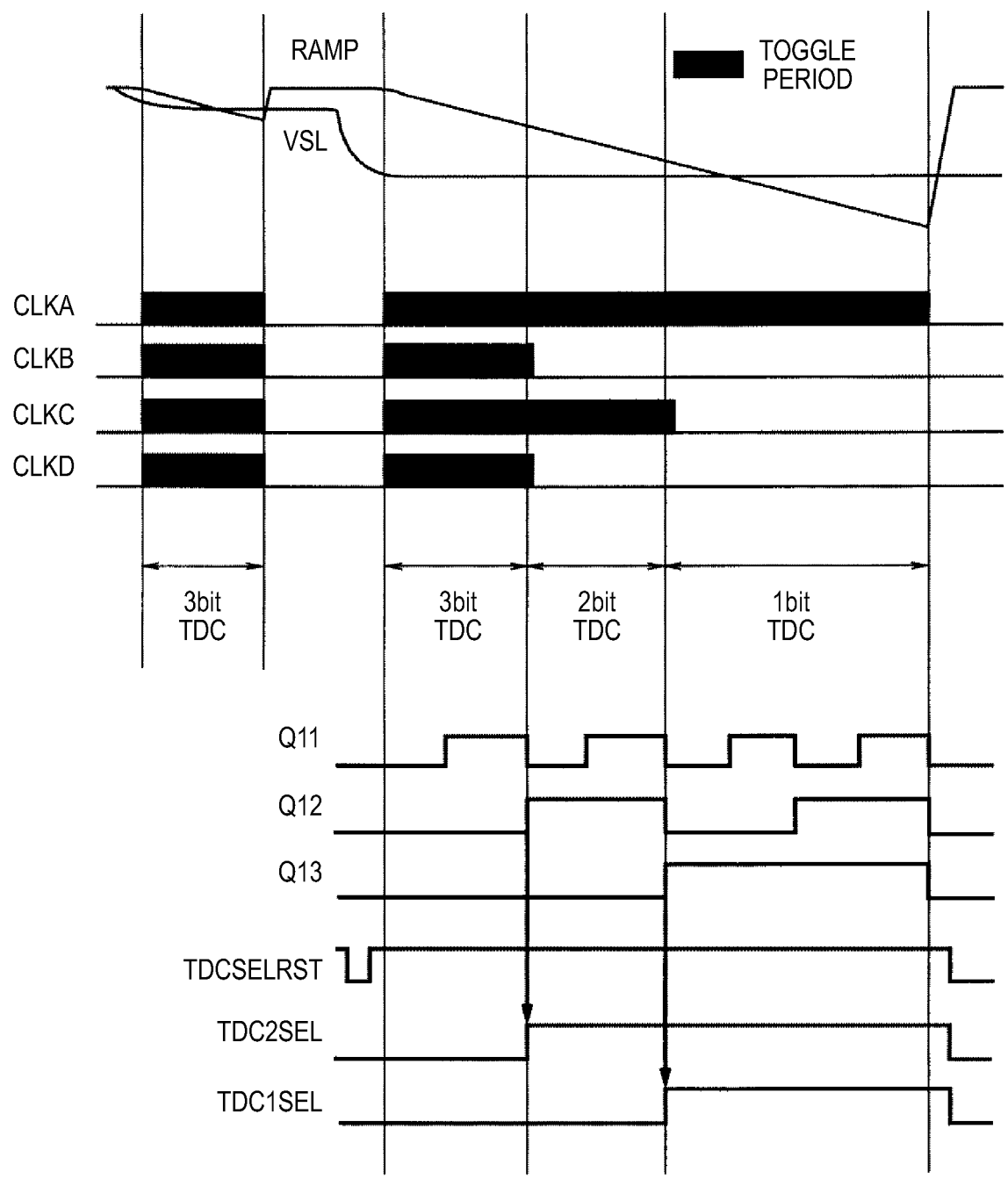
FIG. 33 is a diagram for explanation of an operation of the circuit shown in FIG. 3.

Referring to FIG. 33, a principal of recognizing the illuminance and the resolution in the respective columns with respect to the TDC groups with different resolution in the respective columns depending on different illuminance. The A/D converter circuit 20 shown in FIG. 3 belongs to an integrating A/D converter circuit and up-counts the A/D conversion period, and accordingly, when the period in which the clock signals are stopped is set to a point at which the counter value changes, the configuration of referring to the counter value in reverse may be formed. Specifically, by forming the configuration of referring to the upper bits, in which A/D conversion period the VCO changes and the extension code is latched may be identified in each column.

In the example shown in FIG. 33, the Q[12] and the Q[13] are referred to. After the Q[12] first becomes "1", the predetermined clock signals are stopped as the 2-bit TDC, and then, after the Q[13] first becomes "1", the predetermined clock signals are stopped as the 1-bit TDC. Further, processing is performed to assert a control signal TDC2SEL when the Q[12] first becomes "1" in the logic circuit, and assert a control signal TDC1SEL when the Q[13] first becomes "1" in the logic circuit. Through the processing, it is known that in which region the VCO changes by the control signal TDC2SEL and the control signal TDC1SEL in each column, and decode processing of resolution corresponding to FIG. 34 is performed using this.

Referring to FIG. 34, when the control signal TDC2SEL and the control signal TDC1SEL are not asserted ("0"), the latch-decode circuit 23 (FIG. 3) functions as the 3-bit TDC. When the control signal TDC2SEL is asserted ("1") and the control signal TDC1SEL is not asserted ("0"), the latch-decode circuit 23 functions as the 2-bit TDC. When both the control signal TDC2SEL and the control signal TDC1SEL are asserted ("1"), the latch-decode circuit 23 functions as the 1-bit TDC. The condition that the control signal TDC2SEL is not asserted ("0") and the control signal TDC1SEL is asserted ("1") is not caused, and not defined as an operation mode. If the condition is caused, error handling is executed.

Figure 35:
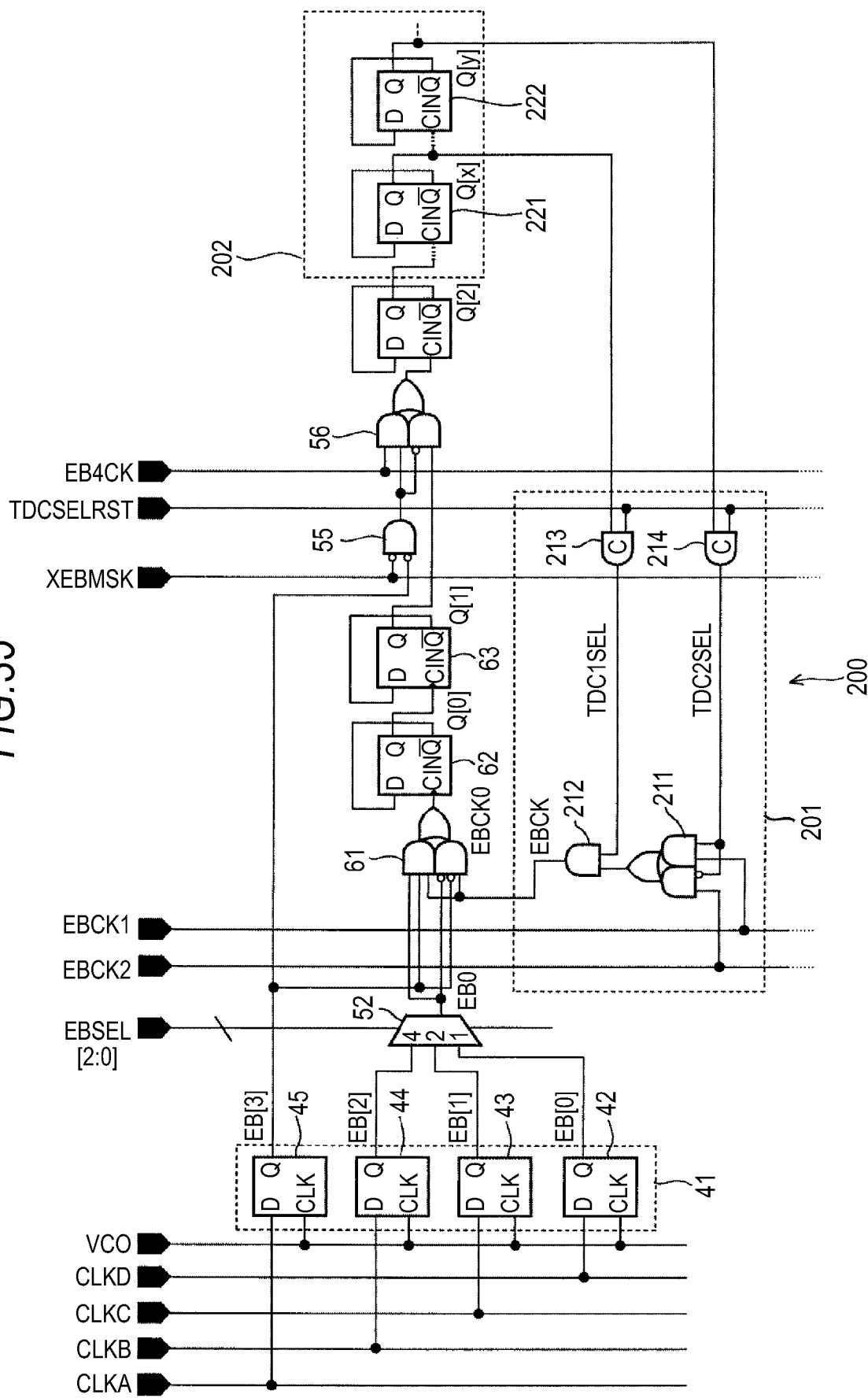
FIG. 35 shows details of the circuit that performs the operation shown in FIG. 33.

The A/D converter circuit 20 performing the processing has a configuration as shown in FIG. 35. The same signs are assigned to the same parts as those of the A/D converter circuit 20 shown in FIG. 4, and their explanation will be omitted. An A/D converter circuit 200 shown in FIG. 35 has a configuration formed by adding a TDC resolution switching circuit 201 to the A/D converter circuit 20 shown in FIG. 4.

Further, FIG. 35 shows an upper bit ripple counter 202 as a ripple counter of the upper bits forming the ripple counter 24. The ripple counter 24 includes flip-flops in the number of the bit number to be counted, and, of them, a flip-flop 221 and a flip-flop 222 as counters of the upper bits are shown. The flip-flop 221 counts the Q[x] of the upper bits and the flip-flop 222 counts the Q[y] of the upper bits.

The x and y are "12" and "13" in the case of the A/D converter circuit 200 of performing processing that has been explained with reference to FIG. 33. However, the x and y are not limited to "12" and "13", but may be connected to the predetermined flip-flops within the ripple counter 24 and refer to the outputs. Further, not limited to the embodiment of referring to the continuous outputs, but an embodiment of referring to the discontinuous outputs may be employed. Furthermore, a configuration of not only referring to two outputs but also referring to other outputs may be employed.

The TDC resolution switching circuit 201 has an AND-OR circuit 211 including two AND circuits and one OR circuit, an AND circuit 212, and Muller C-elements 213, 214. The Muller C-element is known as a waiting element, and is a circuit of, when two inputs are the same, outputting the value and, when the two inputs are different, retaining and outputting the previous output value. The first input terminal of the first two-input AND circuit of the AND-OR circuit 211 is connected to the supply line of a pulse signal EBCK2. A control signal TDC2SEL from the AND circuit 214 is supplied to the second negative input terminal of the first two-input AND circuit.

The first input terminal of the second two-input AND circuit of the AND-OR circuit 211 is connected to the supply line of a pulse signal EBCK1. The control signal TDC2SEL from the Muller C-element 214 is supplied to the second input terminal of the second two-input AND circuit. The outputs from the first two-input AND circuit and the second two-input AND circuit are supplied to the OR circuit. The output from the OR circuit is supplied to the first input terminal of the AND circuit 212. A control signal TDC1SEL from the Muller C-element 213 is supplied to the second negative input terminal of the AND circuit 212.

The output from the AND circuit 212 is supplied to the first input terminal of the first three-input AND circuit and the first input terminal of the second three-input AND circuit of the AND-OR circuit 61 as pulse signals EBCK.

Figure 36A:
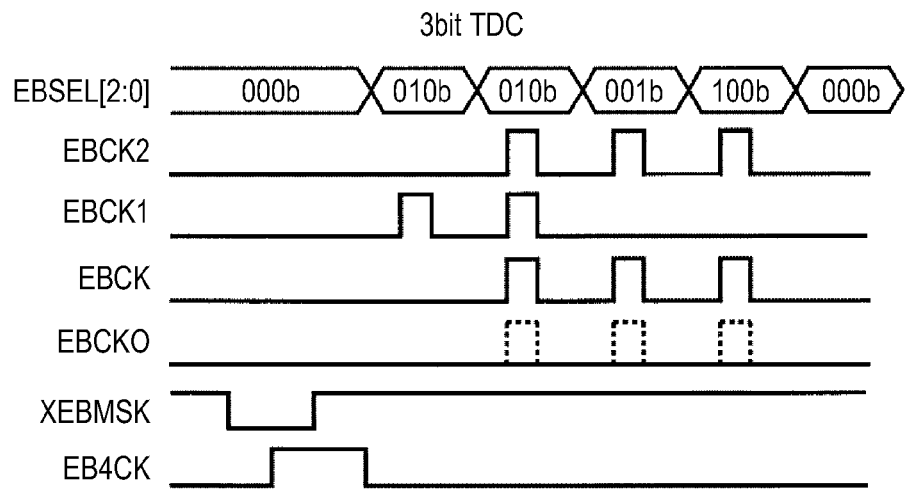
FIGS. 36A to 36C are diagrams for explanation of operations of the circuit shown in FIG. 35.
Figure 36B:
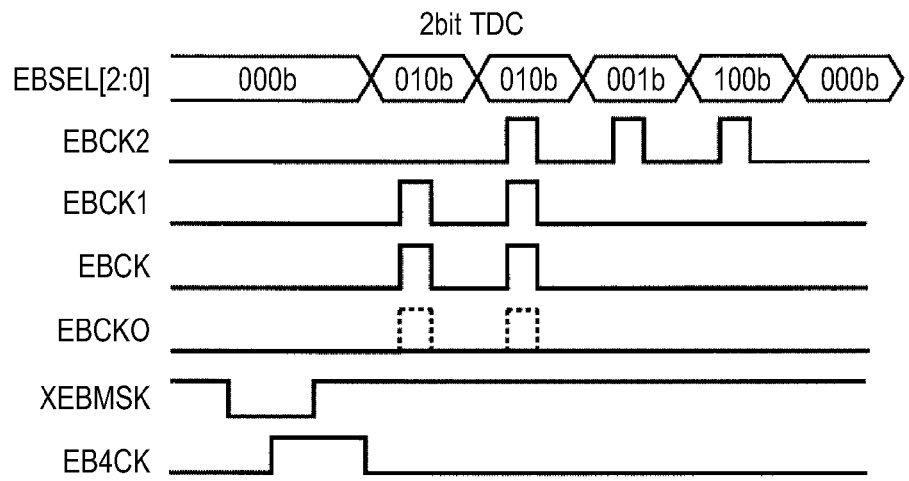
Figure 36C:
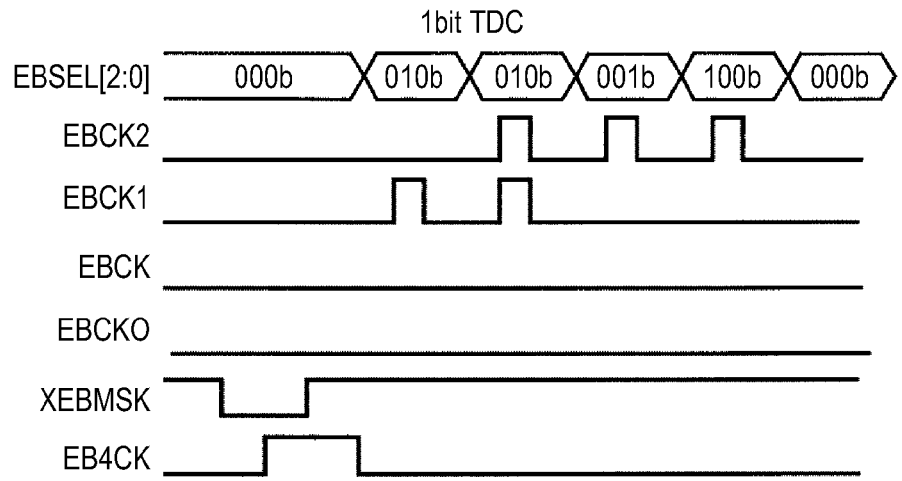

Operations of the A/D converter circuit 200 having the configuration will be explained with reference to FIGS. 36A to 36C. FIGS. 36A to 36C show waveforms of control signals. FIG. 36A shows a waveform when the latch-decode circuit 23 (FIG. 3) functions as a 3-bit TDC, and FIG. 36B shows a waveform when the circuit functions as a 2-bit TDC, and FIG. 36C shows a waveform when the circuit functions as a 1-bit TDC. The control waveforms shown in FIGS. 36A to 36C are waveforms of the control signals supplied to the latch-decode circuit 23, and the contents of the latch-decode circuit 23 are part of the A/D converter circuit 200 shown in FIG. 35.

The control waveforms shown in FIGS. 36A to 36C are waveforms of the control signals supplied to the A/D converter circuit 200, and, for comparison, reference to the waveforms of the control signals supplied to the A/D converter circuit 20 (FIG. 4) shown in FIGS. 17A to 17C are made again. For example, FIG. 17A and FIG. 36A are compared. It is known that FIG. 36A has the control signal EBCK2 and the control signal EBCK1 added to FIG. 17A. The control signal EBCK, the control signal EBCKO, the control signal XEBMSK, and the control signal EB4CK are signals for performance of the same control in the A/D converter circuit 20 and the A/D converter circuit 200.

However, in the A/D converter circuit 20 (FIG. 4), the control signal EBCK is a signal externally supplied and commonly supplied to the respective columns, and, in the A/D converter circuit 200 (FIG. 35), the control signal EBCK is different in that it is a signal generated from the control signal EBCK1 and the control signal EBCK2. In other words, in the A/D converter circuit 20 (FIG. 4), the control signal EBCK is the signal externally supplied, and, in the A/D converter circuit 200 (FIG. 35), the control signal EBCK is the self-generated signal.

Accordingly, in the A/D converter circuit 200, the individual columns can execute decode processing with optimal resolution in the columns based on the control signals EBCK different in the respective columns. Thereby, compared to the A/D converter circuit 20, in the A/D converter circuit 200, there may be little possibility of the deterioration of linearity and the loss of monotonic increasing characteristics that can occur when the control signal EBCK is commonly supplied to the respective columns.

Referring to FIGS. 36A to 36C, two pulses for 2-bit TDC are distributed in the control signal EBCK1 and three pulses for 3-bit TDC are distributed in the control signal EBCK2 in the entire columns, and, by selecting and masking the control signal EBCK1 and control signal EBCK2 in response to the values of the control signal TDC2SEL and the control signal TDC1SEL, decoding in response to the resolution can be performed.

Here, EBSEL [2:0] are arranged to be accessed to the EB[2] once, the EB[1] twice, and the EB[0] once at times shifted for both the 3-bit TDC and the 2-bit TDC.

As shown in FIG. 36A, when (TDC2SEL,TDC1SEL)=(0, 0), the operation mode is the 3-bit TDC. In this regard, the control signal EBCK2 is selected for the decode pulse and three pulses are output to the control signal EBCK. The counting is performed depending on whether or not the pulse passes through the control signal EBCKO according to the value of the EB[3] and the values of the accessed EB[2:0] is the same as that in the case that has been explained with reference to FIGS. 17A to 17C.

As shown in FIG. 36B, when (TDC2SEL,TDC1SEL)=(1, 0), the operation mode is the 2-bit TDC. In this regard, the control signal EBCK1 is selected for the decode pulse and two pulses are output to the control signal EBCK. The counting is performed depending on whether or not the pulse passes through the control signal EBCKO according to the value of the EB[3] and the value of the twice-accessed EB[1] is the same as that in the case that has been explained with reference to FIGS. 17A to 17C.

As shown in FIG. 36C, when (TDC2SEL,TDC1SEL)=(1, 1), the operation mode is the 1-bit TDC. In this regard, the control signal EBCK2 and the control signal EBCK1 are masked and no pulse is generated in the control signal EBCK. Accordingly, if there is access by the EBSEL[2:0], no pulse is generated in the EBCKO.

In this manner, the decode processing is executed based on the control signal TDC2SEL and control signal TDC1SEL, and thus, in the A/D converter circuit 200 shown in FIG. 35, by stopping the clock signals in the predetermined region (for example, the white region), the power consumption may be reduced at least by the amount of the stopped clock signals. Stopping the clock signals makes the resolution lower, however, because the resolution is lower in the region less affected by the lower resolution (for example, the white region), the final decode values are not affected and the image quality may be maintained.

That is, according to the embodiment, by reducing the resolution (switching the resolution) in the predetermined region, the power consumption can be reduced without deterioration of the image quality. Further, when the resolution is reduced, i.e., the clock signals are stopped, by performing decode processing with reference to the upper bits in the ripple counter based on the signals generated by assertion of the predetermined control signals (in the above described example, the control signal TDC2SEL and control signal TDC1SEL), the deterioration of linearity and the loss of monotonic increasing characteristics can be prevented. That is, even when the resolution is reduced, the image quality at the same level as that before reduction of the resolution can be maintained.

As described above, in the integrating A/D converter having comparators that compare the reference voltage having the ramp waveform with the voltage value linearly changing with time to the input voltages, the upper bit counters that start operation or stop operation by inversion of the outputs of the comparators as triggers and performing count with respect to each period of the clock signals, and time-to-digital converters (TDCs) that latch the phase information at the times when the outputs of the comparators are inverted using the plural clock signals at different phases, decode the values, and thereby, output the lower bits with the higher resolution than the periods of the clock signals, by reducing the resolution of the TDCs in the white (light) region in response to the illuminance, the clock signals having unnecessary phase information are stopped and the power consumption can be reduced.

The integrating A/D converter may be applied to a CMOS image sensor having integrating A/D converters in column parallel, and, with respect to the groups of TDCs with different resolution in columns depending on differences of illuminance, the possibility of deterioration of the DNL (differential non linearity) and the deterioration of linearity caused by performance of uniform decode control in response to the specific resolution in the entire columns can be relaxed by control of the logical values to be fixed when the clock signals are stopped.

Further, in the case where the integrating A/D converter is applied to a CMOS image sensor having integrating A/D converters in column parallel, with respect to the TDC groups with different resolution in columns depending on differences of illuminance, by observing the changes of the upper bits of the counters in the respective columns, the illuminance and the resolution of the columns may be recognized, the decode control can be selectively performed in response to the resolution of the respective columns from the plural decode controls distributed in the entire columns, and deterioration of the DNL (differential non linearity) and the deterioration of linearity may be prevented.

Regarding Embodiment 2

FIG. 37 shows a configuration of one embodiment of an A/D converter (analog digital converter). An A/D converter 300 has a reference voltage supply unit 321, a comparator 322, a latch-decode circuit 323, a ripple counter 324, and a gray code counter 325. The latch-decode circuit 323 includes a latch circuit and a decode circuit.

The A/D converter 300 is an integrating A/D converter that acquires the lower bits by an upper bit counter and a GC counter (gray code counter) characterized in that the change between adjacent values is constantly 1 bit. FIG. 37 shows an A/D converter with resolution of 14 bits including a ripple counter of the upper 9 bits and a GC counter of the lower 5 bits as an example.

The comparator 322 compares a reference voltage Vramp having a ramp waveform with a voltage value linearly changing with time supplied from the reference voltage supply unit 321 to an input voltage VSL, and outputs an output signal VCO at the level in response to the result to the latch-decode circuit 323.

When the level of the output signal VCO of the comparator 322 is inverted, the latch-decode circuit 323 latches gray codes and outputs latch data GC. The gray codes GC[4:0] for 5 bits are supplied from the gray code counter 325 to the latch-decode circuit 323. A reference clock signal CLK is supplied to the gray code counter 325.

The latch-decode circuit 323 converts latch information into pulse (train) and outputs the pulse as a count clock signal of the ripple counter 324. The ripple counter 324 converts the phase information of the clock signals into binary codes as the least significant bit of the ripple counter in response to the count clock signal of the latch-decode circuit 323.

Figure 38:
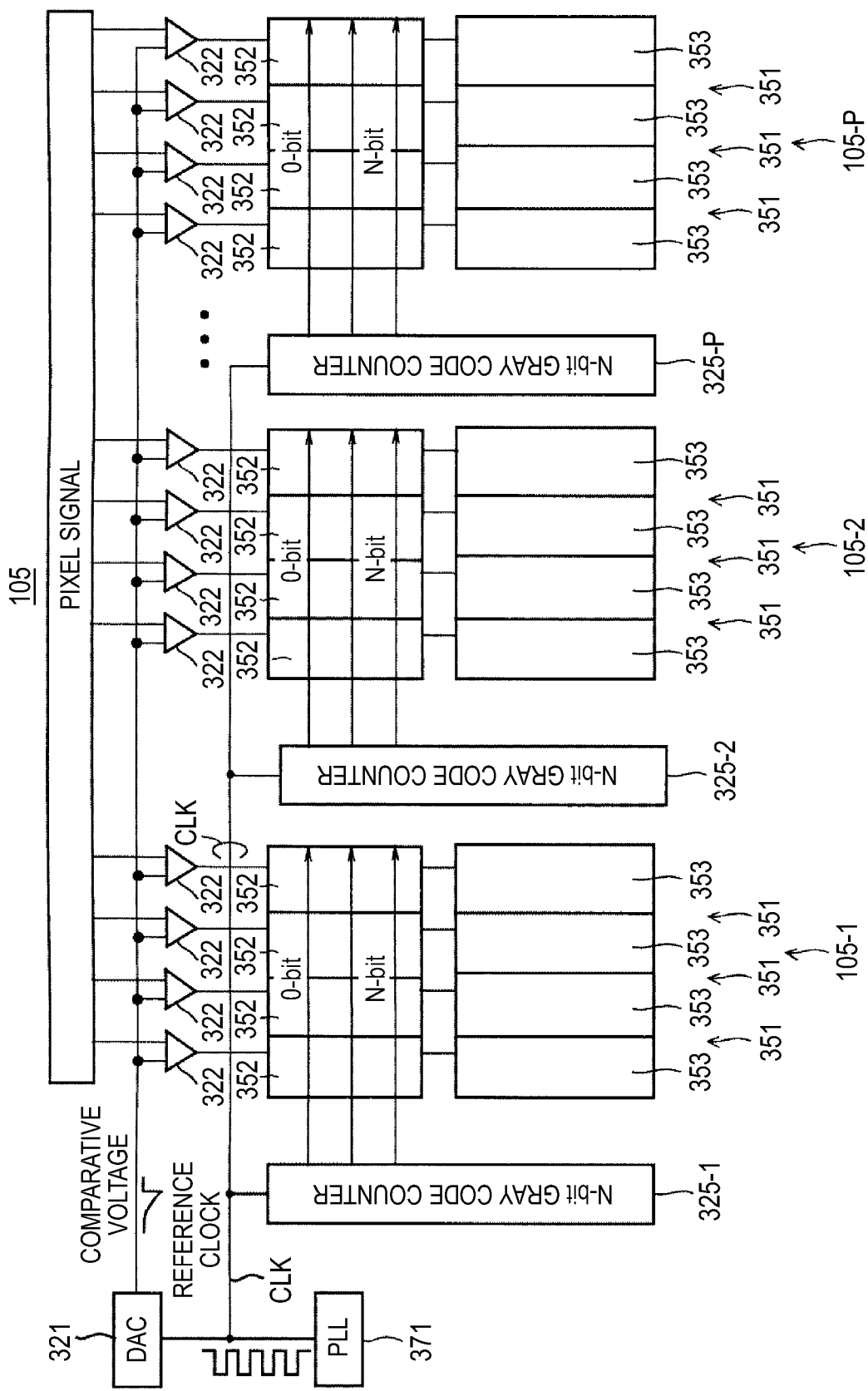
FIG. 38 shows details of the circuit shown in FIG. 37.

In the case where the A/D converters 300 shown in FIG. 37 are applied to an image sensor in column parallel arrangement, for example, when the application is as shown in FIG. 18, the column processing circuit group 105 has a configuration as shown in FIG. 38.

The column processing circuit group 105 includes ADCs of the lower N bits and the upper M bits. For example, the column processing circuit group 105 includes ADCs of 14 bits in total of the lower 5 bits and the upper 9 bits. The column processing circuit group 105 has plural ADC blocks 105-1 to 105-P including plural columns. In other words, the column processing circuit group 105 is segmented into plural ADC blocks, each ADC block including plural columns. One ADC has the configuration of the A/D converter 300 shown in FIG. 37.

In the column processing circuit group 105, each of gray code counters 325-1 to 325-P is provided in each of the ADC blocks 105-1 to 105-P. The gray code counters 325-1 to 325-P function as code conversion counters. In each column, a column processing part 351 that performs comparison processing, lower bit latch, and upper bit count operation with respect to each column is provided.

The column processing part 351 has the comparator 322 that compares a reference signal RAMP (Vslop) as a ramp waveform with changed gradient generated by the DAC 321 (reference voltage supply unit 321) to an analog signal VSL obtained from pixels via a vertical signal line with respect to each row line. The column processing part 351 has a lower bit latch part 352 of the lower N bits that latches the count value according to the output of the comparator 322 and the count results of the gray code counters 325-1 to 325-P.

The column processing part 351 has an upper bit counter part 353 for upper M bits that performs count operation according to the latch output of the most significant lower bit latch circuit of the lower bit latch part 352. The lower bit latch part 352 corresponds to the latch-decode circuit 323 and the upper bit counter part 353 corresponds to the ripple counter 324.

The reference signal RAMP is generated as a ramp waveform with the voltage value linearly changing with time, for example. The comparator 322 of each column processing part 351 compares the reference signal RAMP to the analog signal VSL read from the addressed pixel of a pixel part (not shown) to the vertical signal line. Here, the comparator 322 outputs the output signal VCO at the high level until the reference signal RAMP coincides with the analog signal VSL, and inverts the level of the output signal VCO from the high level to the low level at coincidence.

With the inversion of the output level of the output signal VCO of the comparator 322 as a trigger, the latch operation of the gray codes GC[0] to [4] in the lower bit latch part 352 is performed. Each gray code counter 325 generates a gray code GC of N bits as a digital code according to the reference clock signal CLK at the frequency fn (MHz), for example, generated in a PLL circuit 371 contained in the timing control circuit and propagated in the clock signal supply line.

The plural N-bit gray codes GC are formed as codes in which level transits between logical "0" and logical "1" only for one bit. The gray code counter 325 performs count operation according to the reference clock signal CLK at the frequency fn and generates the gray codes GC[0] to [4] of 5 (=N) bits at the divided frequencies.

The gray code counter 325 generates the least significant gray code GC[0] at the frequency (1/2)fn, generates the gray code GC[1] at the frequency (1/4)fn, and generates the gray code GC[2] at the frequency (1/8)fn MHz. Further, the gray code counter 325 generates the gray code GC[3] and the most significant gray code GC[4] at the frequency (1/16)fn. The respective gray code counters 325 supply the generated gray codes to the lower bit latch parts 352 for the plural columns included in the same ADC blocks 105-1 to 105-P.

The gray code counter 325 generates the binary codes BC[0] to BC[4] at the falling edge of the input reference clock signal CLK, and generates input clock signals and binary codes BC[0] to BC[4]. Further, the counter re-synchronizes the respective bits by the clock signal CK at the same frequency as that of the reference clock signal CLK and its inverted signal XCK, and outputs the gray codes GC[0] to GC[4]. The respective gray code counters 325 supply the generated gray codes to the lower bit latch parts 352 for the plural columns included in the same ADC blocks 105-1 to 105-P.

Figure 39:
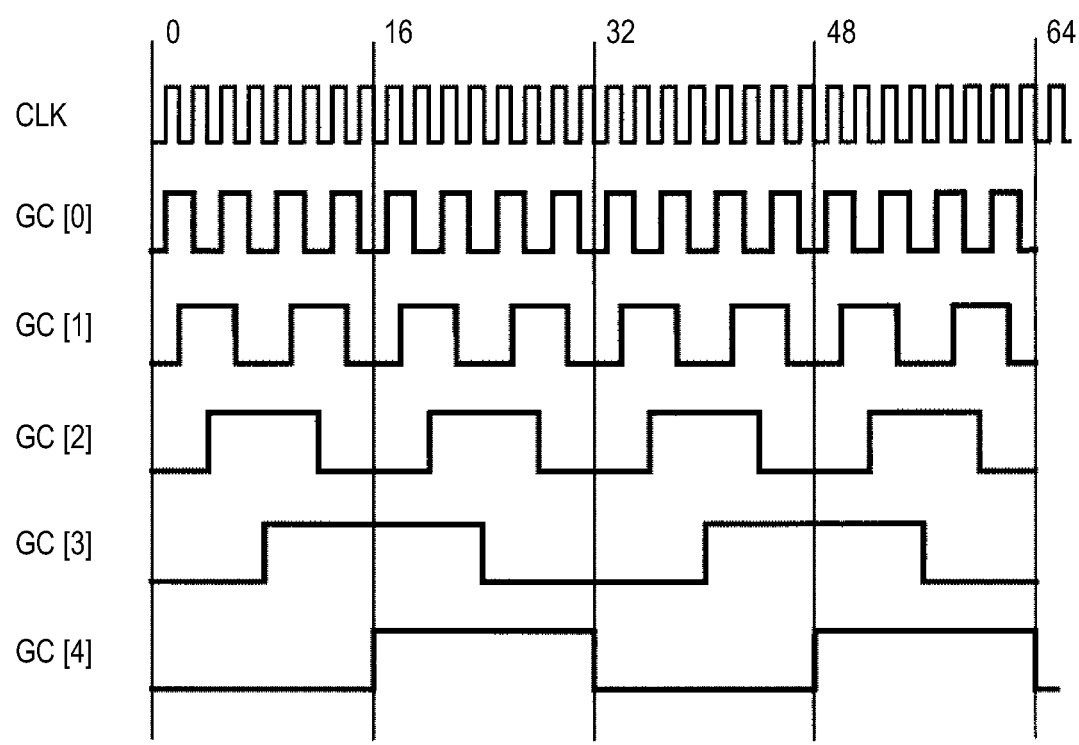
FIG. 39 is a diagram for explanation of an operation of the circuit shown in FIG. 37.

FIG. 39 shows waveforms of the reference clock signal CLK and the gray codes GC[4:0]. The reference voltage RAMP having the ramp waveform with the voltage value linearly changing with time supplied from the reference voltage supply unit 321 and the input voltage VSL are compared in the comparator 322, and the comparison result is output as the VCO and supplied to the latch-decode circuit 323. In each column, the upper counter starts or stops operation at the time when the VCO changes. Further, the lower bit latch part 352 respectively loads and latches the gray code GC[0], the gray code GC[1], the gray code GC[2], the gray code GC[3], and the gray code GC[4] by the gray code counter 325.

Figure 40:
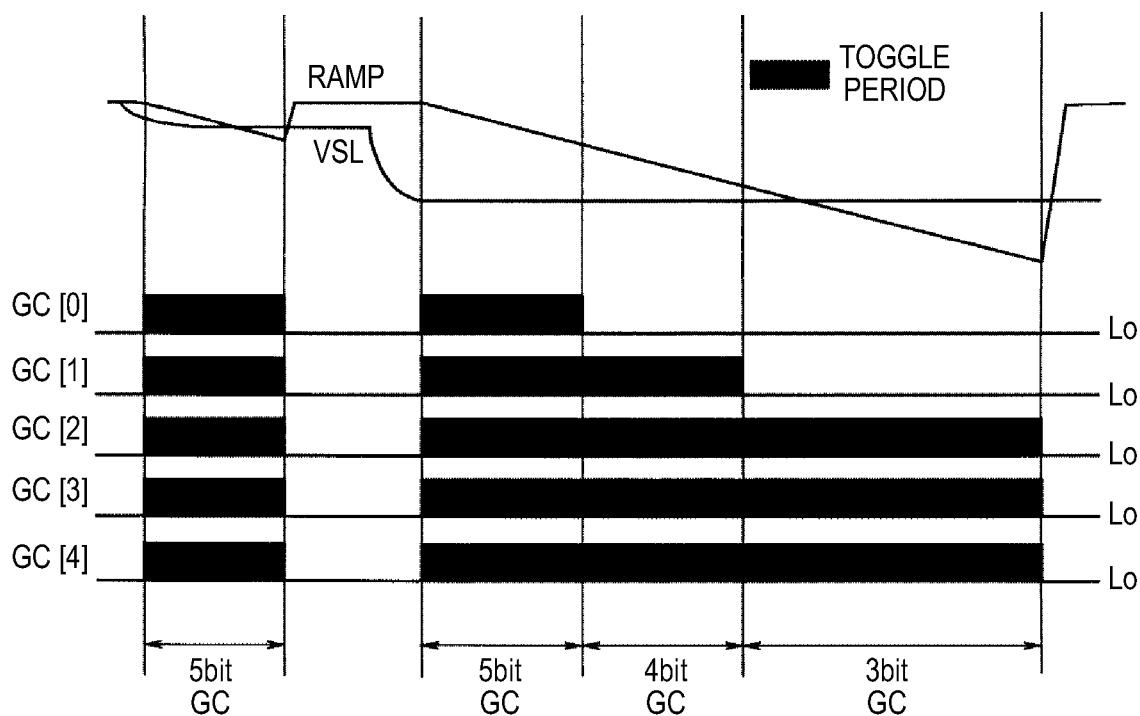
FIG. 40 is a diagram for explanation of switching among operation modes.

Also, in the A/D converter 300 using the gray codes, the power consumption is reduced by reducing the resolution in the predetermined region. This will be explained with reference to FIG. 40. FIG. 40 shows an A/D conversion period and operation periods of the gray codes GC[4:0]. In the first half of the A/D conversion period, counting is performed at the higher potential of the pixel output VSL (lower illuminance) and, in the second half of the A/D conversion period, counting is performed at the lower VSL potential (higher illuminance).

In the A/D conversion period, the circuit is operated in a 5-bit GC operation mode with higher resolution in the black region with lower illuminance, and the gray codes GC[4:0] are output in the gray code counter 325. Further, from the region where the image quality is not substantially lower even when the resolution is reduced, the output of the least significant gray code GC[0] is stopped, and the circuit is shifted to a 4-bit GC operation mode and operated as a 4-bit GC. Furthermore, then, the output of the next gray code GC[1] is stopped, and the circuit is shifted to a 3-bit GC operation mode and operated as a 3-bit GC. Subsequently, the circuit may subsequently be shifted to a 2-bit GC operation mode and a 1-bit GC operation mode, or the shift of the operation mode may be stopped in the 3-bit GC operation mode.

In this manner, by sequentially reducing the resolution (switching the resolution), the power consumption can be reduced. As a method of reducing the resolution, the outputs of the gray codes may be stopped. It is clear that, by stopping the outputs of the gray codes, the current consumption may be reduced by the amount of stopped GC[1:0] in the predetermine region (for example, the white region) compared to the case where the gray codes GC[4:0] are continuously output from the gray code counter 325.

Figure 41:
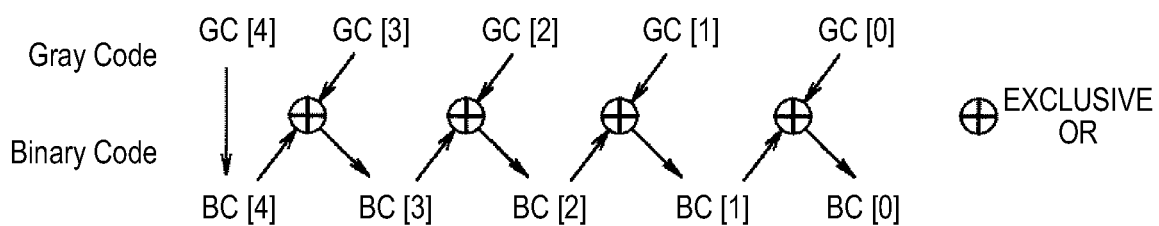
FIG. 41 is a diagram for explanation of decode.

Note that, only by stopping the outputs of the gray codes, the linearity may be deteriorated. With reference to FIG. 41, an algorithm of converting the gray codes GC[n:0] of n+1 bits into binary values BC [n:0] will be explained. FIG. 41 shows a method of converting the gray codes GC[4:0] of 5 bits into binary values BC[4:0].

The most significant gray code GC[n] is converted into the most significant binary value BC[n] as it is, and then, the binary values are obtained based on the following equation (6).

$$BC[m-1]=BC[m]\oplus GC[m-1] \qquad (6)$$

wherein $\oplus$ is exclusive OR

From the equation (6), it is known that the lower binary code BC[m−1] is calculated by an exclusive OR of the upper binary code BC[m] and the gray code GC[m−1] corresponding to the lower binary code.

In the explanation according to FIG. 41, first, the most significant gray code GC[4] is converted into the binary code BC[4] as it is. The lower bits are converted into the binary codes BC by an exclusive OR (EXOR) of the gray code GC latched at the stage of itself and the binary code BC at the previous stage, and thus, the binary code BC[3] is obtained by EXOR of the gray code GC[3] latched at the stage of itself and the binary code BC[4] at the previous stage.

Similarly, the binary code BC[2] is obtained by EXOR of the gray code GC[2] latched at the stage of itself and the binary code BC[3] at the previous stage, the binary code BC[1] is obtained by EXOR of the gray code GC[1] latched at the stage of itself and the binary code BC[2] at the previous stage, and the binary code BC[0] is obtained by EXOR of the gray code GC[0] latched at the stage of itself and the binary code BC[1] at the previous stage. In this manner, the binary code is obtained using the gray codes with the same significance as that of the lower binary code.

Figure 42:
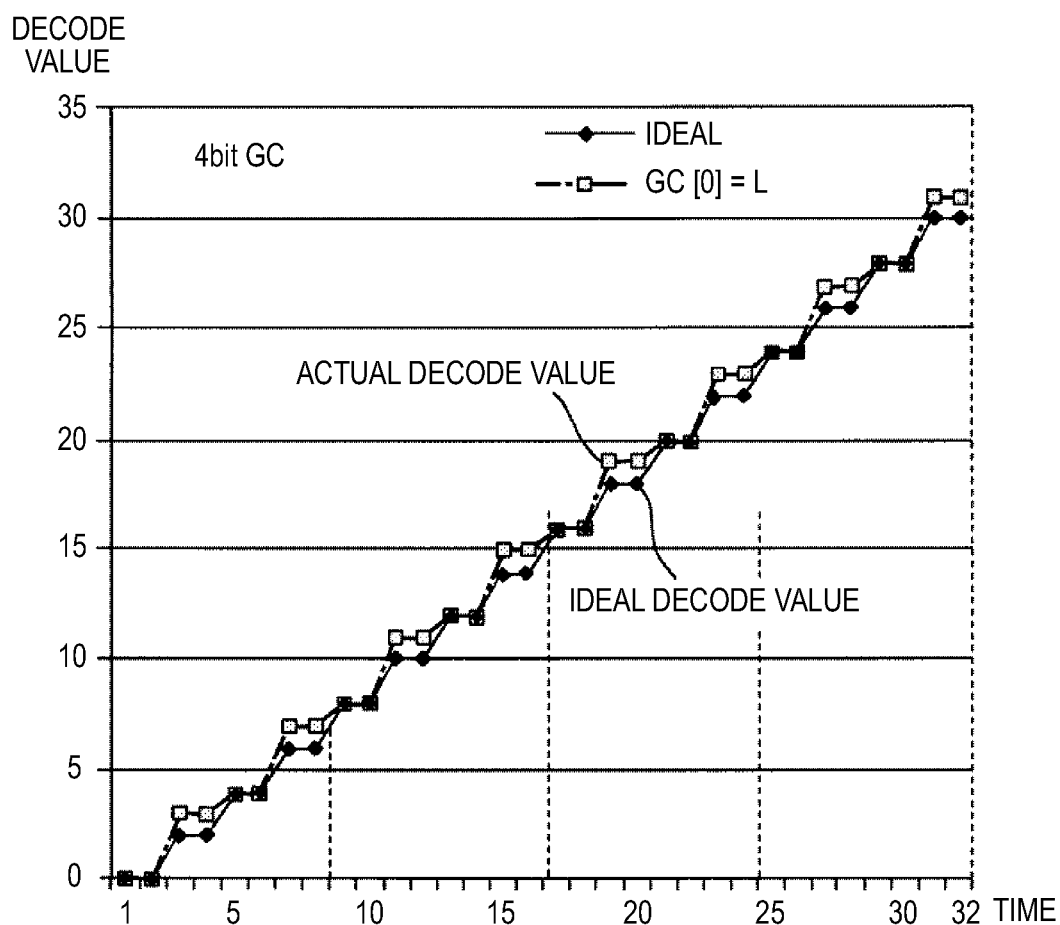
FIG. 42 is a diagram for explanation of linearity.

In FIG. 42, linearity of A/D conversion is shown by the results of the conversion into binary values according to the above described algorithm with the time on the horizontal axis and the decode value on the vertical axis. In FIG. 42, the actual decode values are values when the gray code GC[0] is Lo-fixed and stopped as shown in FIG. 40. In FIG. 42, circle points are the plots of the ideal decode values, square points are the plots of the actual decode values when the circuit operates in the 4-bit GC operation mode.

Figure 43:
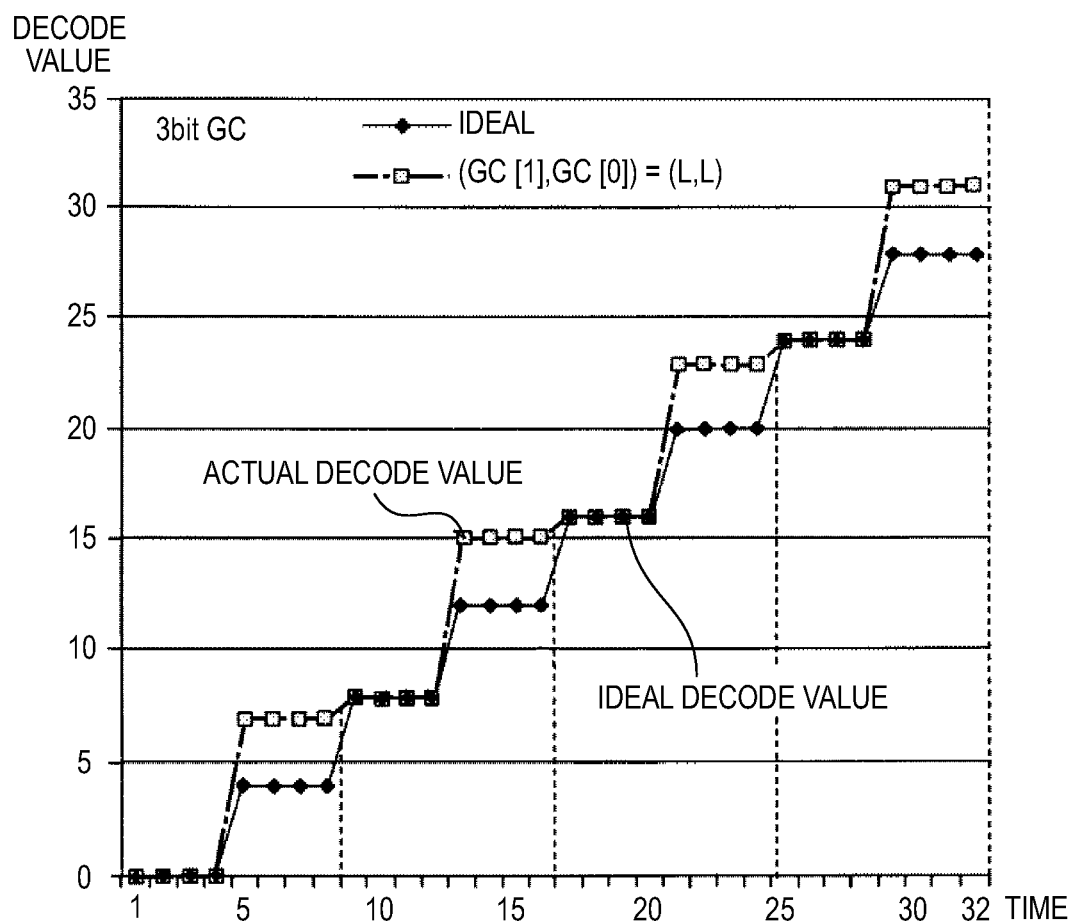
FIG. 43 is a diagram for explanation of linearity.

From FIG. 42, it can be seen that the ideal decode values deviate from the actual decode values. Further, in FIG. 43, linearity of A/D conversion is shown by the results of the conversion into binary values according to the above described algorithm when the gray code GC[1] and the gray code GC[0] are Lo-fixed with the time on the horizontal axis and the decode value on the vertical axis. In FIG. 43, circle points are the plots of the ideal decode values, square points are the plots of the actual decode values when the circuit operates in the 3-bit GC operation mode.

Also, in the case shown in FIG. 43, it can be seen that the ideal decode values deviate from the actual decode values. In this manner, when the gray codes are stopped, if they are Lo-fixed, the linearity may be deteriorated.

Regarding the actual decode values shown in FIGS. 42, 43, when the outputs of the gray codes are stopped, they are Lo-fixed. That is, the outputs of the gray codes are stopped under the condition that GC[0]=L or GC[1], GC[0]=(L, L). The linearity may be improved not by stopping the outputs in this manner, but changing the logical values to be stopped.

Figure 44:
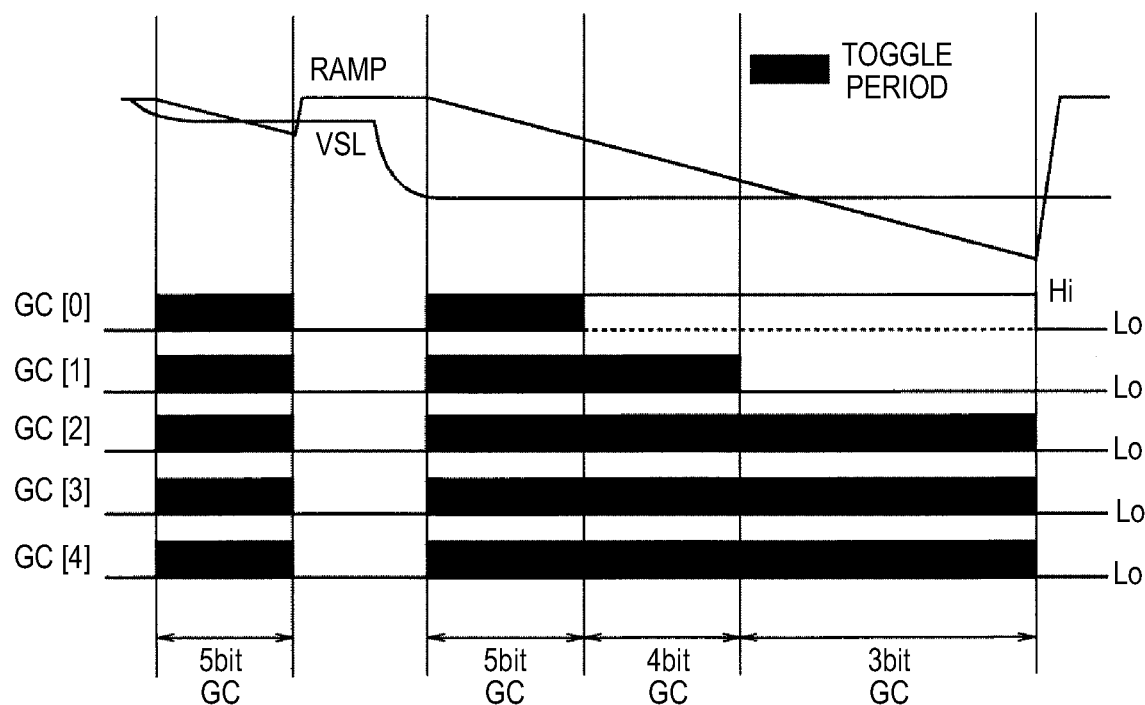
FIG. 44 is a diagram for explanation of switching among operation modes.

FIG. 44 shows an example in which, when the least significant gray code GC[0] is stopped in the gray code counter, it is not Lo-fixed, but Hi-fixed in the stopping of the clock signals in the white region. That is, under the condition that GC[0]=H, the outputs of the gray codes are stopped. By stopping in this manner, in the period in which the outputs of the gray codes are stopped (the period in which the clock signals are stopped), the value latched in each column is not the logical value "0", but the logical value "1" is stored. This applies to the algorithm of converting the gray codes into the binary values, and then, the linearity is improved.

It has been confirmed that, in the operation region of the 4-bit GC, there is no change in linearity if the GC[0] is Lo-fixed or Hi-fixed. It has been confirmed that, in the operation region of the 3-bit GC, the linearity is improved if the codes are fixed as (GC[1], GC[0])=(Lo, Hi), (Hi, Hi). This is shown in FIG. 45. FIG. 45 shows a table in which combinations of the logical values of the two gray codes GC[1], GC[0] to be stopped in the 3-bit GC operation region and the maximum errors thereof.

When both the gray code GC[0] and the gray code GC[1] are Lo-stopped, the maximum error is 3 LSB. When the gray code GC[0] is Lo-stopped and the gray code GC[1] is Hi-stopped, the maximum error is 3 LSB. When the gray code GC[0] is Hi-stopped and the gray code GC[1] is Lo-stopped, the maximum error is 2 LSB. When both the gray code GC[0] and the gray code GC[1] are Hi-stopped, the maximum error is 2 LSB.

From the results, if the condition that the gray code GC[0] is Hi-stopped and the gray code GC[1] is Lo-stopped is set or the condition that both the gray code GC[0] and the gray code GC[1] are Hi-stopped is set, the maximum error of the decode value becomes smaller and, even when the clock signals are stopped, the deterioration of the precision of the decode values is suppressed to the minimum. Further, by changing the logical values when the codes are stopped in the several combinations, the linearity may be improved. Thus, here, only an example is shown, but the limitation of the combinations is not shown.

Figure 46:
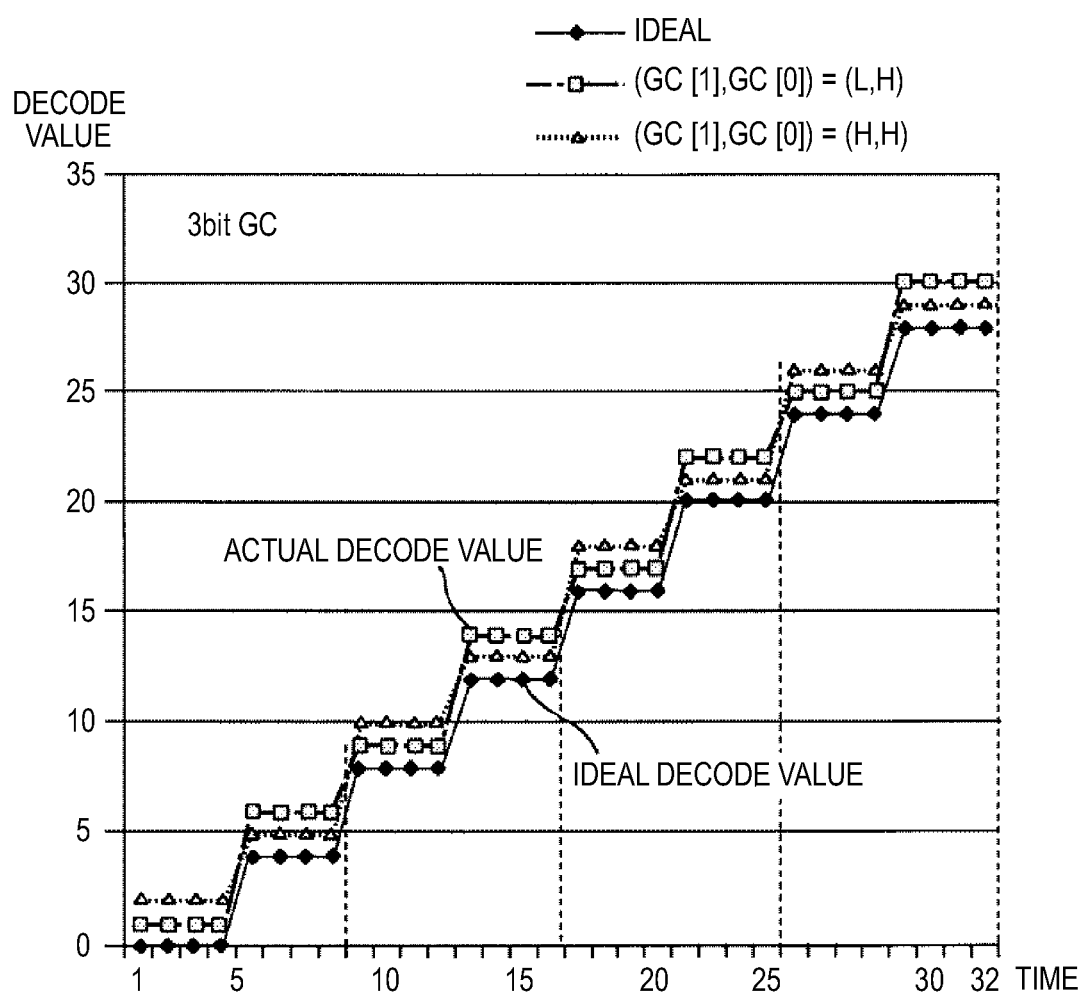
FIG. 46 is a diagram for explanation of linearity.

FIG. 46 shows linearity of A/D conversion with the time on the horizontal axis and the decode value on the vertical axis. FIG. 46 shows results of the 3-bit GC operation region. FIG. 46 corresponds to FIG. 43, and FIG. 43 shows the decode values when the codes are stopped at GC[1], GC[0]=(L, L) and FIG. 46 shows the decode values when the codes are stopped at GC[1], GC[0]=(L, H) or at GC[1], GC[0]=(H, H). Further, in FIG. 46, circle points are the plots of the ideal decode values, square points are the plots of the decode values when the gray codes are stopped at GC[1], GC[0]=(L, H), and triangle points are the plots of the decode values when the gray codes are stopped at GC[1], GC[0]=(H, H).

As shown in FIG. 46, it can be seen that the decode values when the codes are stopped at GC[1], GC[0]=(L, H) or at GC[1], GC[0]=(H, H) deviate from the actual decode values, but the deviation widths are smaller than that in the case shown in FIG. 43. That is, the linearity is more improved when the codes are stopped at GC[1], GC[0]=(L, H) or at GC[1], GC[0]=(H, H) than when the codes are stopped at GC[1], GC[0]=(L, L).

Further, reference to FIG. 43 is made again. In FIG. 43, the rate of increase of the decode value from time 4 to time 5 and the rate of increase of the decode value from time 8 to time 9 are different. In this case, they are monotonically increase, however, the difference between the rates of increase is larger. On the other hand, in FIG. 46, the rate of increase of the decode value from time 4 to time 5 and the rate of increase of the decode value from time 8 to time 9 are nearly equal. In this case, they are monotonically increase and the difference between the rates of increase is smaller. From the results, it is known that the monotonic increasing characteristics are also improved.

In an integrating A/D converter having comparators that compare the reference voltage having the ramp waveform with the voltage value linearly changing with time to the input voltages, the upper bit counters that start operation or stop operation with inversion of the outputs of the comparators as triggers and counting the clock signals with respect to each period of the clock signal, and gray-binary combined counters that output the lower bits by latching the gray codes generated from the clock signals by the gray code counters and decoding the values, the current consumption can be reduced by stopping the outputs of the gray codes to be unnecessary by reducing the resolution from the gray code counters in the white (light) region in response to the illuminance.

Further, the integrating A/D converters may be applied to a CMOS image sensor in column parallel arrangement, with respect to the groups of gray-binary combined counters with different resolution in columns depending on differences of illuminance, the possibility of deterioration of the DNL (differential non linearity) and the deterioration of linearity caused by performance of uniform decode control in the entire columns can be relaxed by control of the logical values when the gray codes output from the gray code counters are stopped.

Note that, in the above described embodiments, the integrating A/D converter has been explained as an example, however, not limited to the integrating type, the present disclosure may be applied to a sequential comparison type, a pipeline type, a ΣΔ type, or the like.

[Regarding Recording Media]

The above described series of processing may be executed by hardware or software. In the case where the series of processing is executed by software, the programs forming the software are installed in a computer. Here, the computer includes a computer incorporated in dedicated hardware, a general-purpose computer, for example, that can execute various functions by installation of various programs, or the like.

FIG. 47 is a block diagram showing a configuration example of hardware of a computer that executes the above described series of processing using programs. In the computer, a CPU (Central Processing Unit) 1001, a ROM (Read Only Memory) 1002, a RAM (Random Access Memory) 1003 are mutually connected via a bus 1004. An input/output interface 1005 is further connected to the bus 1004. An input unit 1006, an output unit 1007, a memory unit 1008, a communication unit 1009, and a drive 1010 are connected to the input/output interface 1005.

The input unit 1006 includes a keyboard, a mouse, a microphone, etc. The output unit 1007 includes a display, a speaker, etc. The memory unit 1008 includes a hard disc, a nonvolatile memory, or the like. The communication unit 1009 includes a network interface or the like. The drive 1010 drives a magnetic disc, an optical disc, a magneto-optical disc, or a removable medium 1011 such as a semiconductor memory.

In the computer having the above described configuration, the above described series of processing is performed by the CPU 1001 loading the program stored in the memory unit 1008, for example, via the input/output interface 1005 and the bus 1004 in the RAM 1003 and executing it.

The program executed by the computer (CPU 1001) may be recorded and provided in the removable medium 1011 as a package medium or the like, for example. Further, the program may be provided via a wired or wireless transmission medium such as a local area network, the Internet, or digital satellite broadcasting.

In the computer, the program may be installed in the memory unit 1008 via the input/output interface 1005 by mounting of the removable medium on the drive 1010. Further, the program may be received by the communication unit 1009 via a wired or wireless transmission medium and installed in the memory unit 1008. In addition, the program may be installed in the ROM 1002 and the memory unit 1008 in advance.

Note that the program executed by the computer may be a program for performing time-series processing along the order that has been explained in this specification, or a program for performing processing in parallel or at times necessary when a call is made.

Further, in the specification, the system refers to the entire equipment including plural devices.

Note that the embodiments of the present disclosure are not limited to the above described embodiments, but, various changes may be made without departing from the scope of the present disclosure.

The present disclosure contains subject matter related to that disclosed in Japanese Priority Patent Application JP 2011-052084 filed in the Japan Patent Office on Mar. 9, 2011, the entire contents of which are hereby incorporated by reference.

What is claimed is:

1. An A/D converter configured to switch from a first resolution of m bits to a second resolution of n bits smaller than the m bits at a predetermined time, wherein the first resolution is switched to the second resolution by partially stopping clock signals having plural phase differences to be supplied at the first resolution at the predetermined time.

2. The A/D converter according to claim 1, wherein, when the clock signals having plural phase differences at the first resolution are supplied and the clock signals are stopped for switching to the second resolution, at least one clock signal of the clock signals to be stopped is stopped under a condition that a logical value is "1".

3. The A/D converter according to claim 1, wherein lower bits according to the clock signal are decoded in response to predetermined output within a ripple counter that counts upper bits.

4. An A/D converter configured to switch from a first resolution of m bits to a second resolution of n bits smaller than the m bits at a predetermined time, wherein the resolution is switched to the second resolution by partially stopping gray code counters to be supplied at the first resolution at the predetermined time.

5. The A/D converter according to claim 4, wherein, when plural gray codes are supplied at the first resolution and the gray codes are stopped for switching to the second resolution, at least one gray code of the gray codes to be stopped is stopped under a condition that a logical value is "1".

6. The A/D converter according to claim 1, wherein the predetermined time is a time into a white region.

7. An A/D converter configured to switch from a first resolution of m bits to a second resolution of n bits smaller than the m bits at a predetermined time, wherein the predetermined time is a time into a region in which a change of 1 LSB is buried in noise.

8. An A/D converter configured to switch from a first resolution of m bits to a second resolution of n bits smaller than the m bits at a predetermined time, further comprising:

a comparison unit configured to compare a reference voltage having a ramp waveform with a voltage value linearly changing with time to an input voltage;

an upper bit counter configured to start operation or stop operation with inversion of an output of the comparison unit as a trigger, and perform counting with respect to each period of the clock signal; and a time quantization unit configured to output lower bits with the higher resolution than the period of the clock signal by latching phase information at a time when the output of a comparator is inverted using plural clock signals at different phases and decoding the value.

9. An A/D converter configured to switch from a first resolution of m bits to a second resolution of n bits smaller than the m bits at a predetermined time, further comprising:
  a comparison unit configured to compare a reference voltage having a ramp waveform with a voltage value linearly changing with time to an input voltage;
  an upper bit counter configured to start operation or stop operation with inversion of an output of the comparison unit as a trigger, and perform counting with respect to each period of the clock signal; and
  a lower bit counter that outputs lower bits by latching gray codes generated by the gray code counters from the clock signals and decoding the values.

10. An A/D converter configured to switch from a first resolution of m bits to a second resolution of n bits smaller than the m bits at a predetermined time, wherein the A/D converter is one of a plurality of A/D converters provided in an image sensor and the same control signals are supplied to respective ones of the plurality of A/D converters.

11. An A/D conversion method comprising
  switching an A/D converter of a plurality of A/D converters provided in an image sensor from a first resolution of m bits to a second resolution of n bits smaller than the m bits at a predetermined time, and
  supplying the same control signals to respective ones of the plurality of A/D converters.

12. A non-transitory computer-readable medium storing program code for controlling an A/D converter, the program code being executable by a processor to perform operations comprising:
  controlling the A/D converter for converting an analog signal into a digital signal to switch from a first resolution of m bits to a second resolution of n bits smaller than the m bits at a predetermined time.

13. The A/D conversion method according to claim 11, further comprising:
  switching the first resolution to the second resolution by partially stopping clock signals having plural phase differences to be supplied at the first resolution at the predetermined time.

14. The A/D conversion method according to claim 11, further comprising:
  switching the first resolution to the second resolution by partially stopping gray code counters to be supplied at the first resolution at the predetermined time.

15. The A/D conversion method according to claim 11, further comprising:
  comparing, by comparison unit, a reference voltage having a ramp waveform with a voltage value linearly changing with time to an input voltage;
  starting operation or stopping operation, by an upper bit counter, with an inversion of an output of the comparison unit as a trigger, and performing counting with respect to each period of the clock signal; and
  outputting, by time quantization unit, lower bits with the higher resolution than the period of the clock signal by latching phase information at a time when the output of a comparator is inverted using plural clock signals at different phases and decoding the value.

16. The A/D conversion method according to claim 11, further comprising:
  comparing, by comparison unit, a reference voltage having a ramp waveform with a voltage value linearly changing with time to an input voltage;
  starting operation or stopping operation, by an upper bit counter, with an inversion of an output of the comparison unit as a trigger, and performing counting with respect to each period of the clock signal; and
  outputting, by a lower bit counter, lower bits by latching gray codes generated by the gray code counters from the clock signals and decoding the values.

17. The non-transitory computer-readable medium according to claim 12, further comprising:
  switching the first resolution to the second resolution by partially stopping clock signals having plural phase differences to be supplied at the first resolution at the predetermined time.

18. The non-transitory computer-readable medium according to claim 12, further comprising:
  switching the first resolution to the second resolution by partially stopping gray code counters to be supplied at the first resolution at the predetermined time.

19. The non-transitory computer-readable medium according to claim 12, further comprising:
  comparing, by comparison unit, a reference voltage having a ramp waveform with a voltage value linearly changing with time to an input voltage;
  starting operation or stopping operation, by an upper bit counter, with an inversion of an output of the comparison unit as a trigger, and performing counting with respect to each period of the clock signal; and
  outputting, by time quantization unit, lower bits with the higher resolution than the period of the clock signal by latching phase information at a time when the output of a comparator is inverted using plural clock signals at different phases and decoding the value.

20. The non-transitory computer-readable medium according to claim 12, further comprising:
  comparing, by comparison unit, a reference voltage having a ramp waveform with a voltage value linearly changing with time to an input voltage;
  starting operation or stopping operation, by an upper bit counter, with an inversion of an output of the comparison unit as a trigger, and performing counting with respect to each period of the clock signal; and
  outputting, by a lower bit counter, lower bits by latching gray codes generated by the gray code counters from the clock signals and decoding the values.

* * * * *